(12) United States Patent
Joo et al.

(10) Patent No.: US 12,414,454 B2
(45) Date of Patent: Sep. 9, 2025

(54) DISPLAY DEVICE AND METHOD FOR MANUFACTURING THE SAME

(71) Applicant: Samsung Display Co., Ltd., Yongin-si (KR)

(72) Inventors: Sun-Kyu Joo, Suwon-si (KR); Keunchan Oh, Hwaseong-si (KR); Min-Jae Kim, Suwon-si (KR); Jae Cheol Park, Hwaseong-si (KR); Dokyung Youn, Suwon-si (KR); Yeogeon Yoon, Seoul (KR); Chang-Hun Lee, Hwaseong-si (KR); Woo-Man Ji, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 484 days.

(21) Appl. No.: 17/988,435

(22) Filed: Nov. 16, 2022

(65) Prior Publication Data
US 2023/0309358 A1    Sep. 28, 2023

(30) Foreign Application Priority Data
Mar. 25, 2022   (KR) .................. 10-2022-0037207

(51) Int. Cl.
*H10K 59/38* (2023.01)
*H10K 50/844* (2023.01)
(Continued)

(52) U.S. Cl.
CPC ........... *H10K 59/38* (2023.02); *H10K 50/844* (2023.02); *H10K 50/854* (2023.02);
(Continued)

(58) Field of Classification Search
CPC .... H10K 59/38; H10K 59/122; H10K 50/858; H10K 50/854; H10K 50/844; H10K 71/00
See application file for complete search history.

(56) References Cited

U.S. PATENT DOCUMENTS

| | | | | |
|---|---|---|---|---|
| 2019/0198573 | A1* | 6/2019 | Kim | H10K 59/8792 |
| 2021/0384467 | A1* | 12/2021 | Park | H10K 59/877 |
| 2023/0126988 | A1* | 4/2023 | Seong | H10K 59/124 |
| | | | | 257/40 |

FOREIGN PATENT DOCUMENTS

| | | |
|---|---|---|
| KR | 101188602 B1 | 10/2012 |
| KR | 101273890 B1 | 6/2013 |

* cited by examiner

*Primary Examiner* — Anne M Hines
(74) *Attorney, Agent, or Firm* — CANTOR COLBURN LLP

(57) ABSTRACT

A display device includes a first substrate including first to third light emitting areas, and a light blocking area surrounding first to third light emitting area, light emitting elements disposed on the first to third light emitting areas of a first substrate, a bank disposed on light emitting elements, where first to third openings exposing light emitting elements are defined in the bank, a first color conversion pattern disposed in the first opening to convert a light of a first wavelength into a light of a second wavelength, a second color conversion pattern disposed in the second opening to convert the light of the first wavelength into a light of a third wavelength, a light transmission pattern disposed in the third opening to transmit the light of the first wavelength, and a column spacer disposed on the bank and having a same composition as the light transmission pattern.

20 Claims, 18 Drawing Sheets

(51) Int. Cl.
*H10K 50/854* (2023.01)
*H10K 50/858* (2023.01)
*H10K 59/122* (2023.01)
*H10K 71/00* (2023.01)

(52) U.S. Cl.
CPC ......... *H10K 50/858* (2023.02); *H10K 59/122* (2023.02); *H10K 71/00* (2023.02)

DISPLAY DEVICE AND METHOD FOR MANUFACTURING THE SAME

This application claims priority to Korean Patent Application No. 10-2022-0037207, filed on Mar. 25, 2022, and all the benefits accruing therefrom under 35 U.S.C. § 119, the content of which in its entirety is herein incorporated by reference.

BACKGROUND

1. Field

Embodiments of the invention relate to a display device and method for manufacturing the display device.

2. Description of the Related Art

Flat panel display devices are replacing cathode ray tube display devices as display devices due to desired characteristics such as lightweight and thin thickness. As representative examples of such flat panel display devices, there are liquid crystal display devices and organic light emitting diode display devices.

Recently, an organic light emitting display device including an organic light emitting diode and a color conversion layer has been studied. The color conversion layer may convert a wavelength of light provided from the organic light emitting element. Accordingly, the organic light emitting diode display may emit light having a color different from that of an incident light.

SUMMARY

Embodiments provide a display device having high display quality, improving process efficiency, and reducing manufacturing cost.

Embodiments provide a method of manufacturing the display device.

A display device according to an embodiment includes a first substrate including first, second and third light emitting areas, and a light blocking area surrounding the first, second and third light emitting area, light emitting elements disposed on the first to third light emitting areas of the first substrate, respectively, a bank disposed on the light emitting elements to correspond to the light blocking area, where first, second and third openings exposing the light emitting elements, respectively, are defined in the bank, a first color conversion pattern disposed in the first opening, where the first color conversion pattern converts a light of a first wavelength into a light of a second wavelength, a second color conversion pattern disposed in the second opening, where the second color conversion pattern converts the light of the first wavelength into a light of a third wavelength, a light transmission pattern disposed in the third opening, where the light transmission pattern transmits the light of the first wavelength, and a column spacer disposed on the bank, where the column spacer has a same composition as the light transmission pattern.

In an embodiment, each of the light transmission pattern and the column spacer may include a scattering particle.

In an embodiment, a content of the scattering particle included in the light transmission pattern may be in a range of about 1 weigh percent (wt %) to about 10 wt % based on a total weight of the light transmission pattern, and a content of the scattering particle included in the column spacer may be in a range of about 1 wt % to about 10 wt % based on a total weight of the column spacer.

In an embodiment, a portion of the light transmission pattern may be in contact with an upper surface of the bank.

In an embodiment, the display device may further include a compensation pattern where an auxiliary opening defined in the bank to correspond to the light blocking area, and the compensation patter may be disposed in the auxiliary opening.

In an embodiment, the compensation pattern may have a same composition as the light transmission pattern and the column spacer.

In an embodiment, the compensation pattern may include a scattering particle.

In an embodiment, the compensation pattern may be spaced apart from an upper surface of the bank.

In an embodiment, a portion of the compensation pattern may be in contact with an upper surface of the bank.

In an embodiment, the upper surface of the bank may be covered by the light transmission pattern, the column spacer, and the compensation pattern.

In an embodiment, wherein a width of the third opening may be smaller than a width of the first opening and a width of the second opening.

In an embodiment, the display device may further include a second substrate disposed opposite to the first substrate, and a color filter layer disposed under the second substrate, where the color filter layer may include a first color filter overlapping the first color conversion pattern, where the first color filter selectively transmits the light of the second wavelength among the lights of the first to third wavelengths, a second color filter overlapping the second color conversion pattern, where the second color filter selectively transmits the light of the third wavelength among the lights of the first to third wavelengths, and a third color filter overlapping the light transmission pattern, where the third color filter selectively transmits the light of the first wavelength among the lights of the first to third wavelengths.

In an embodiment, the display device may further include a refractive layer disposed under the color filter layer.

A method of manufacturing a display device according to an embodiment includes providing light emitting elements in light emitting areas of a first substrate including the light emitting areas and a light blocking area surrounding the light emitting areas, providing a thin film encapsulation layer covering the light emitting elements, providing a bank on the thin film encapsulation layer, where first to third openings exposing the light emitting elements, respectively, are formed in the bank, providing a first color conversion pattern in the first opening, forming a second color conversion pattern in the second opening, providing an organic material layer on the thin film encapsulation layer to cover the bank, the first color conversion pattern, and the second color conversion pattern, and to fill the third opening, and forming a light transmission pattern and a column spacer by removing an area corresponding to the first color conversion pattern and an area corresponding to the second color conversion pattern of the organic material layer.

In an embodiment, the light transmission pattern and the column spacer may have a same composition as each other.

In an embodiment, each of the light transmission pattern and the column spacer may include a scattering particle.

In an embodiment, an auxiliary opening may be further formed in the bank in an area corresponding to the light blocking area, the organic material layer may be provided to fill the auxiliary opening, the organic material layer filled in the auxiliary opening is defined as a compensation pattern.

In an embodiment, the compensation pattern may have a same composition as the light transmission pattern and the column spacer.

In an embodiment, the compensation pattern may include a scattering particle.

In an embodiment, the method may further include bonding the first substrate, on which the first color conversion pattern, the second color conversion pattern, the light transmission pattern and the column spacers are provided, and a second substrate, on which a color filter layer is provided, to each other.

In embodiments, a color conversion layer including a light transmission pattern, a column spacer, and a compensation pattern may be disposed on a lower substrate of the display device. In such embodiments, the light transmission pattern, the column spacer and the compensation pattern may be formed in a same process, and may have a same composition as each other. Accordingly, a conversion rate of light incident to the color conversion layer may increase, and display quality of the display device may be improved. In such embodiments, process efficiency of the display device may be improved, and manufacturing cost may be reduced.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
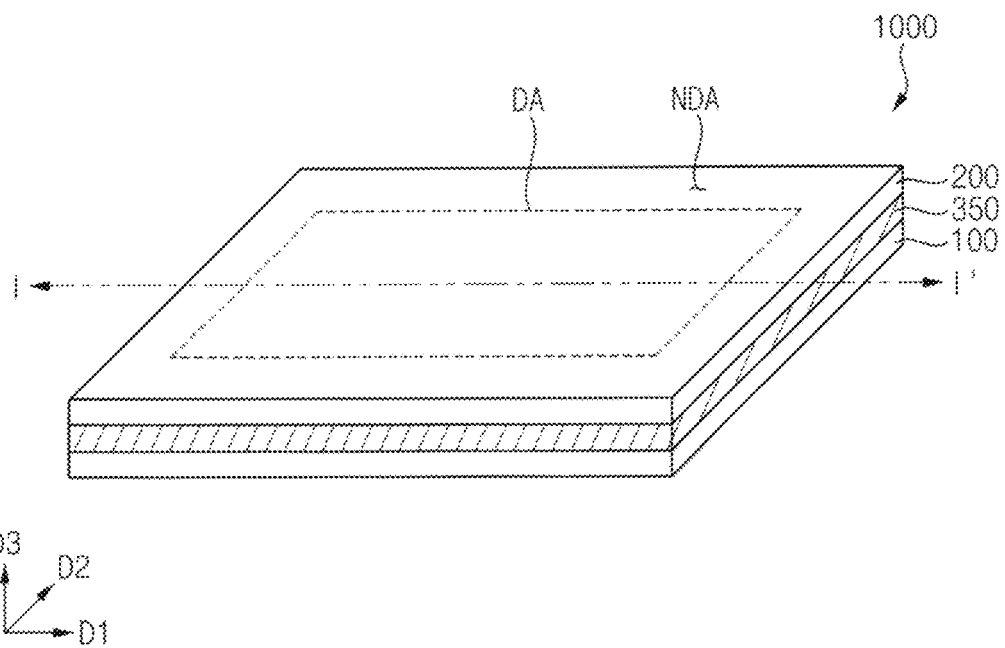
FIG. 1 is perspective view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Illustrative, non-limiting embodiments will be more clearly understood from the following detailed description in conjunction with the accompanying drawings.

Figure 2:
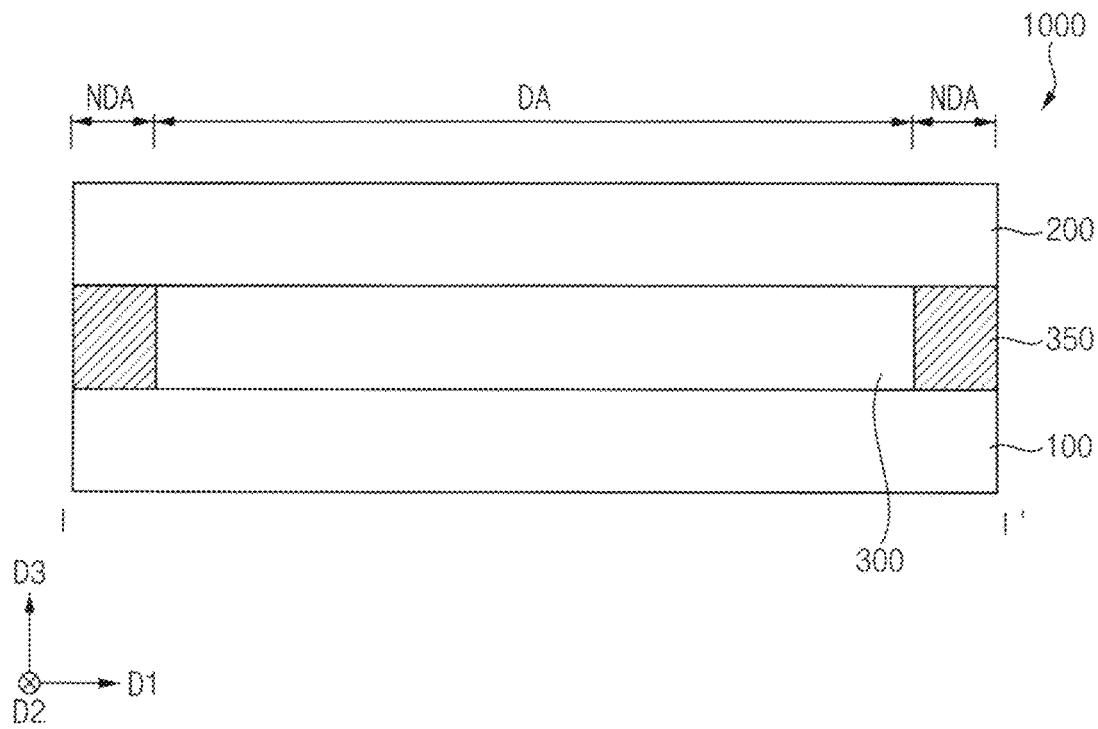
FIG. 2 is a cross-sectional view taken along line I-I' of FIG. 1.

FIG. 1 is perspective view illustrating a display device according to an embodiment, and FIG. 2 is a cross-sectional view taken along line I-I' of FIG. 1.

Referring to FIGS. 1 and 2, the display device 1000 according to an embodiment of the invention may include a lower substrate 100, an upper substrate 200, a filling layer 300, and a sealing member 350.

The display device 1000 may have a rectangular planar shape or a rectangular shape when viewed from a plan view. In an embodiment, for example, the display device 1000 may include two first sides extending in a first direction D1 and two second sides extending in a second direction D2 perpendicular to the first direction D1. Here, a third direction D3 perpendicular to the first direction D1 and the second direction D3 may be a thickness direction of the display device 1000. In an embodiment, an edge where the first side and the second side meet may be a right angle. In an alternative embodiment, an edge where the first side and the second side of the display device 1000 meet may form a curved surface.

The display device 1000 may be divided into a display area DA and a non-display area NDA. The display area DA may display an image, and the non-display area NDA may not display an image. The non-display area NDA may be located around the display area DA. In an embodiment, for example, the non-display area NDA may surround the display area DA.

The lower substrate 100 may include a pixel array and a color conversion layer. Each pixel of the pixel array may include a light emitting element that generates light according to a driving signal. The color conversion layer may convert a color of light emitted from the light emitting element.

The upper substrate 200 may be disposed on the lower substrate 100. The upper substrate 200 may face or be disposed opposite to the lower substrate 100. The upper substrate 200 may include a color filter that transmits light having a specific color.

The lower substrate 100 and the upper substrate 200 will be described later in greater detail.

The filling layer 300 may be disposed between the lower substrate 100 and the upper substrate 200. The filling layer 300 may act as a buffer against external pressure applied to the display device 1000. In an embodiment, for example, the filling layer 300 may maintain a gap between the lower substrate 100 and the upper substrate 200. The filling layer 300 may include a material capable of transmitting light. In an embodiment, for example, the filling layer 300 may include an organic material. In an embodiment, the filling layer 300 may include at least one selected from a silicone-based resin, an epoxy-based resin, and the like, for example. These may be used alone or in combination with each other. In an alternative embodiment, the filling layer 300 may be omitted.

The sealing member 350 may be disposed between the lower substrate 100 and the upper substrate 200 in the non-display area NDA. The sealing member 350 may be disposed along edges of the lower substrate 100 and the upper substrate 200 in the non-display area NDA to surround the display area DA in a plan view. Also, the lower substrate 100 and the upper substrate 200 may be bonded to each other through the sealing member 350. The sealing member 350 may include an organic material. In an embodiment, for example, the sealing member 350 may include an epoxy-based resin or the like.

In an embodiment, the display device 1000 may be an organic light emitting display (OLED) device, but the invention is not limited thereto. In alternative embodiments, the display device 1000 may be a liquid crystal display (LCD) device, a field emission display (FED) device, a plasma display panel (PDP) device, an electrophoretic display (EPD) device, a quantum dot display device, or an inorganic light emitting display device. Hereinafter, for convenience of description, embodiments in which the display device 1000 is the OLED device will be described.

Figure 3:
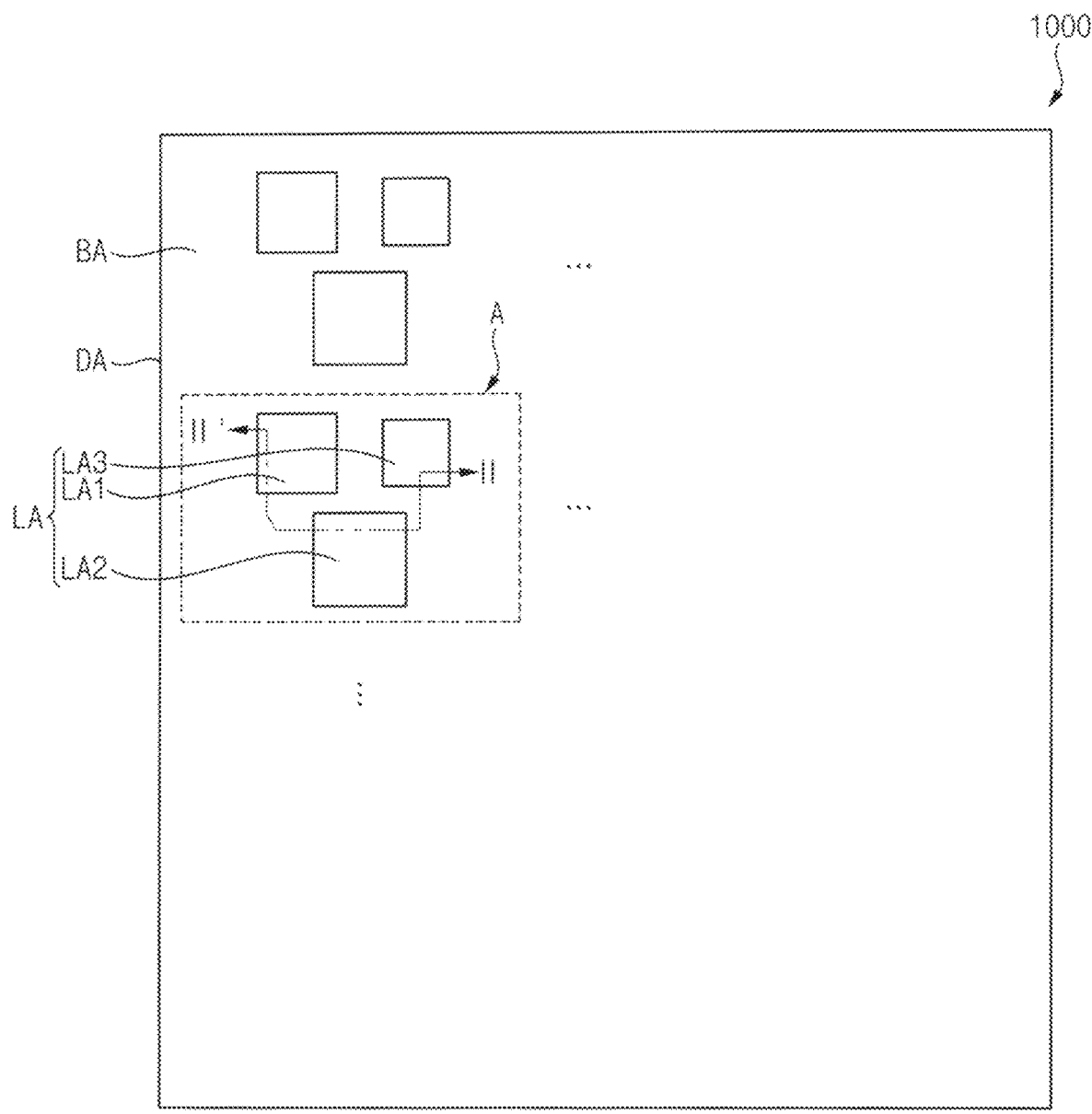
FIG. 3 is a plan view illustrating a display area of the display device of FIG. 1.

FIG. 3 is a plan view illustrating a display area of the display device of FIG. 1.

Referring to FIG. 3, an embodiment of the display area DA may include light emitting areas LA and a light blocking area BA. In such an embodiment, the light-emitting areas LA may include a first light emitting area LA1, a second light emitting area LA2, and a third light emitting area LA3.

Each of the first light emitting area LA1, the second light emitting area LA2, and the third light emitting area LA3 may be an area in which light emitted from the light emitting element is emitted to an outside of the display device 1000. In an embodiment, for example, the first light emitting area LA1 may emit a first light, the second light emitting area LA2 may emit a second light, and the third light emitting area LA3 may emit a third light. In an embodiment, the first light may be red light, the second light may be green light, and the third light may be blue light. However, the invention is not limited thereto. In an alternative embodiment, for example, the light emitting areas LA may be combined to emit yellow, cyan, and magenta lights.

In an embodiment, the light emitting areas LA may emit light of four or more colors. In an embodiment, for example, the light emitting areas LA may be combined to further emit at least one of yellow, cyan, and magenta lights in addition to red, green, and blue lights. In addition, the light emitting areas LA may be combined to further emit white light.

In a plan view, each of the first light emitting area LA1, the second light emitting area LA2, and the third light emitting area LA3 may be repeatedly arranged along a row direction and a column direction. Specifically, in the plan view, each of the first light emitting area LA1, the second light emitting area LA2, and the third light emitting area LA3 may be repeatedly arranged along the first direction D1 and the second direction perpendicular to the first direction D1. In an embodiment, in the plan view, the first light emitting area LA1 and the third light emitting area LA3 may be repeatedly arranged in a first row of the display area DA, and the second light emitting area LA2 may be repeatedly arranged in a second row of the display area DA.

The first light emitting area LA1, the second light emitting area LA2, and the third light emitting area LA3 may have different sizes from each other. In an embodiment, an area of the third light emitting area LA3 that emits blue light may be smaller than an area of each of the first light emitting area LA1 that emits red light and the second light emitting area LA2 that emits green light. In such an embodiment, the area of the second light emitting area LA2 may be larger than the area of the first light emitting area LA1. However, this is only an example, and each size of the first light emitting area LA1, the second light emitting area LA2, and the third light emitting area LA3 may be variously modified.

Each of the first light emitting area LA1, the second light emitting area LA2, and the third light emitting area LA3 has a triangular planar shape, a rectangular planar shape, a circular planar shape, a track-type planar shape, an elliptical planar shape, or the like. In an embodiment, for example, as shown in FIG. 3, each of the first light emitting area LA1, the second light emitting area LA2, and the third light emitting area LA3 may have a rectangular planar shape.

The light blocking area BA may surround the first light emitting area LA1, the second light emitting area LA2, and the third light emitting area LA3 in a plan view. In an embodiment, for example, the light blocking area BA may have a grid shape on a plane surface. The light blocking area BA may not emit light.

Figure 4:
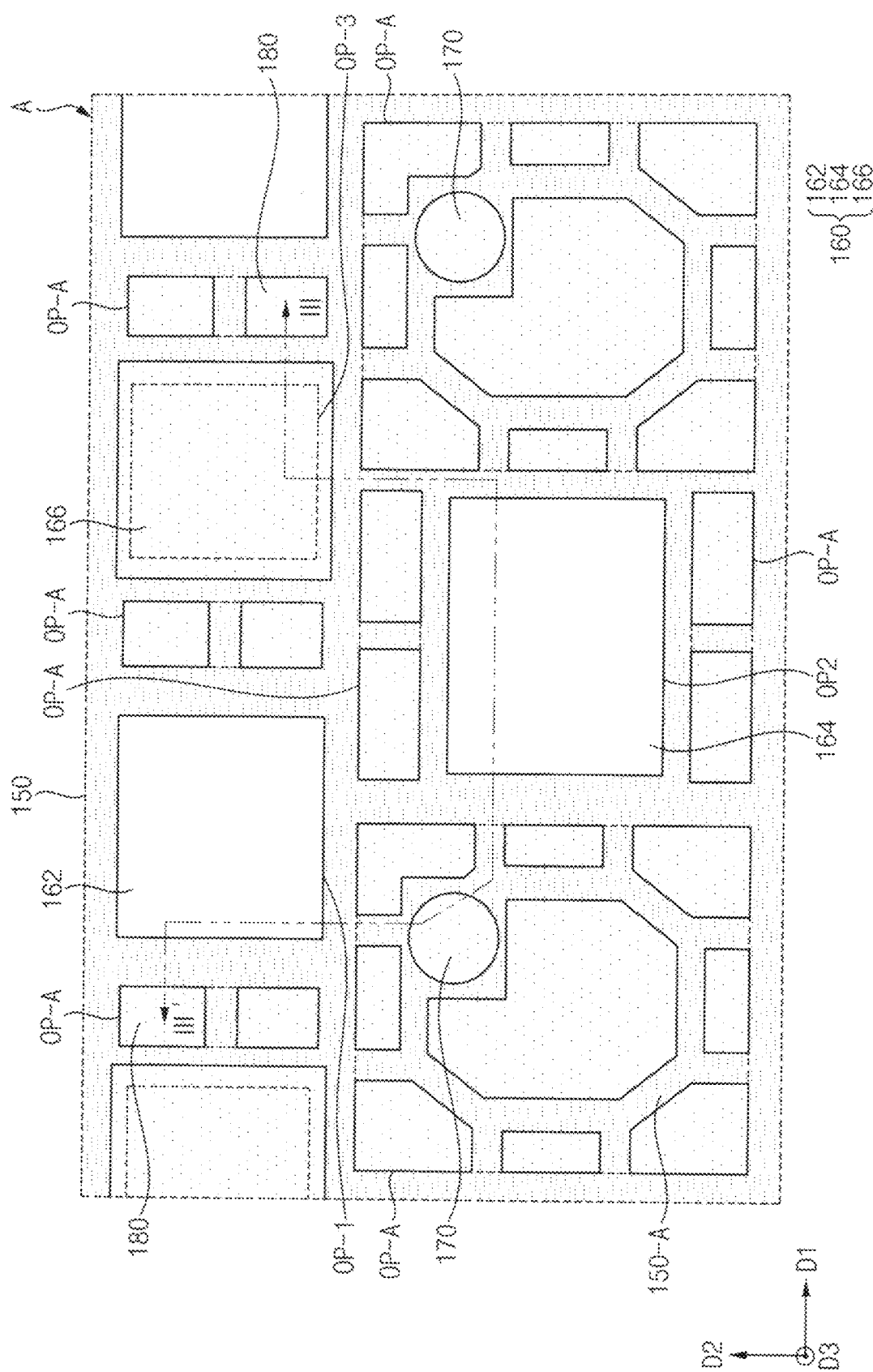
FIG. 4 is an enlarged plan view of a lower substrate of region 'A' of the display device of FIG. 3.
Figure 5:
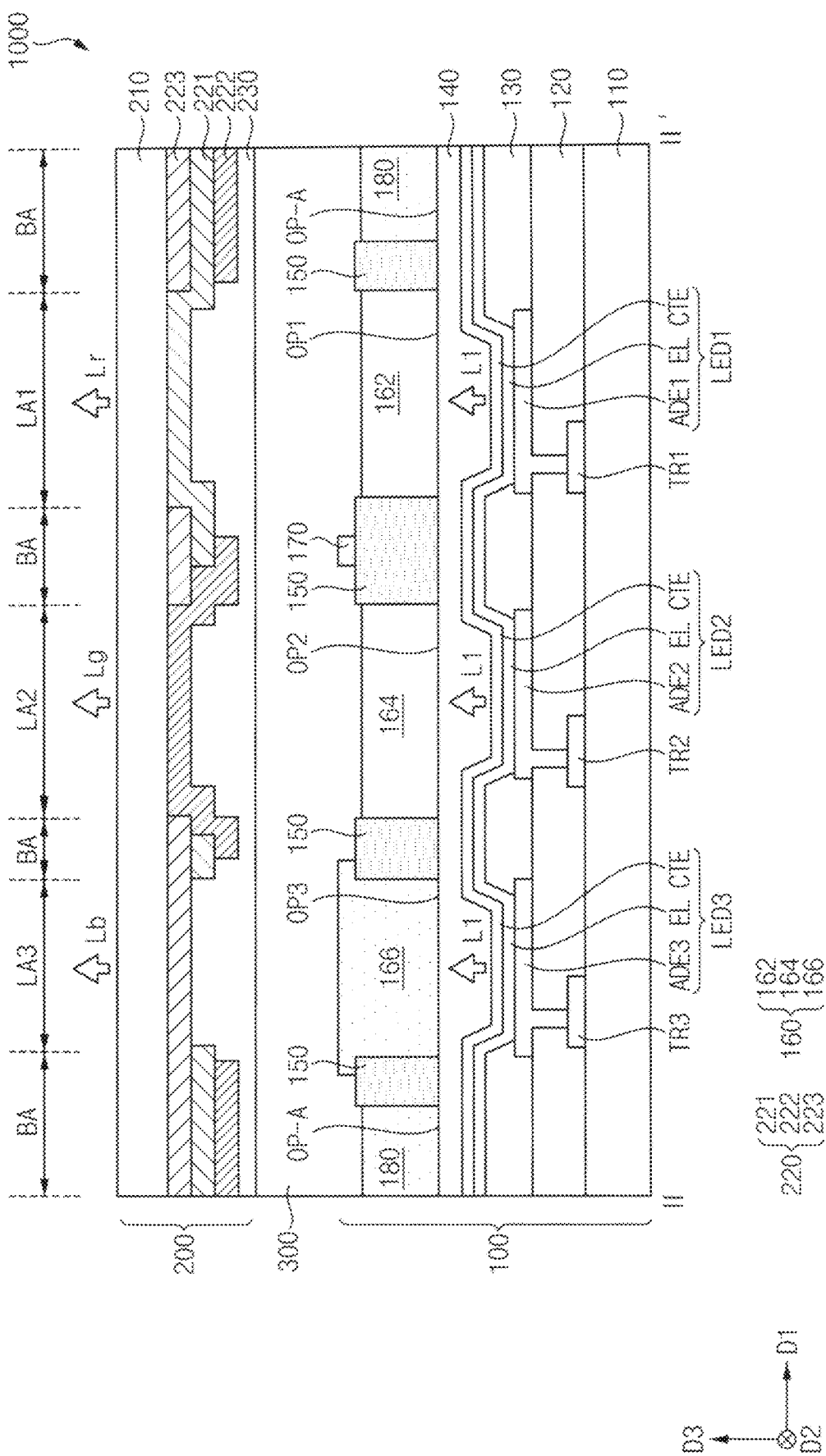
FIGS. 5 and 6 are cross-sectional views taken along line of FIG. 3.
Figure 6:
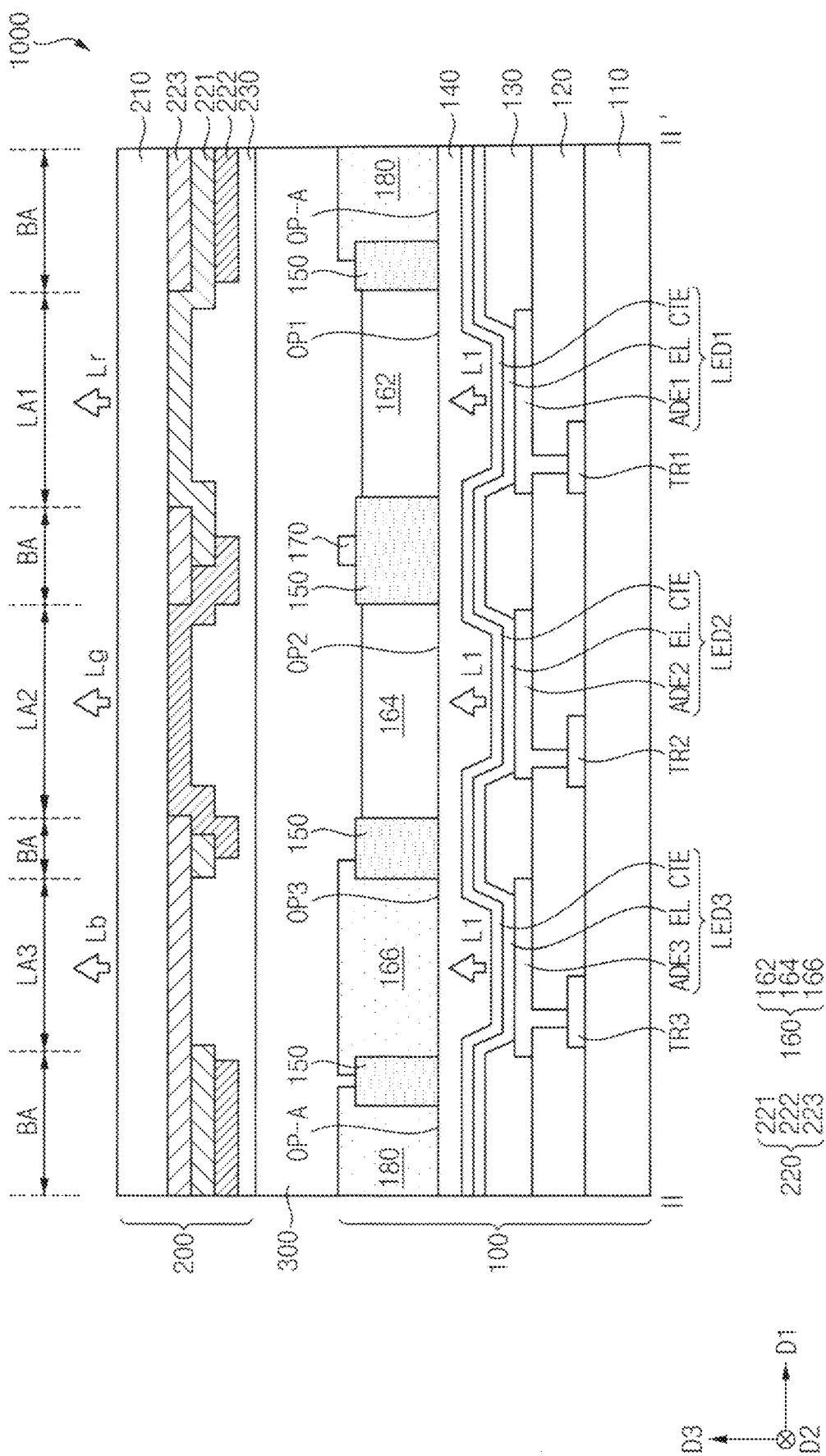

FIG. 4 is an enlarged plan view illustrating a lower substrate of region 'A' of the display device of FIG. 3, and FIGS. 5 and 6 are cross-sectional views taken along line of FIG. 3. Particularly, the cross-section of the lower substrate 100 shown in FIGS. 5 and 6 may correspond to the cross-section taken along line of FIG. 4.

Referring to FIGS. 4 and 5, as described above, the display device 1000 may include the lower substrate 100, the upper substrate 200, and the filling layer 300.

In an embodiment, the lower substrate 100 may include a first substrate 110, first to third driving elements TR1, TR2, TR3, an insulating structure 120, a pixel defining layer 130, and first to third light emitting elements LED1, LED2, LED3, a thin film encapsulation layer 140, a bank 150, a color conversion layer 160, a column spacer 170, and a compensation pattern 180.

The first substrate 110 may be an insulating substrate including or formed of a transparent or opaque material. In an embodiment, the first substrate 110 may include glass. In such an embodiment, the first substrate 110 may be a rigid display substrate. In alternative embodiment, the first substrate 110 may include plastic. In such an embodiment, the first substrate 110 may be a flexible display substrate. The first substrate 110 may include the above-described light emitting areas LA1, LA2, and LA3 and the light blocking area BA.

Each of the first to third driving elements TR1, TR2, and TR3 may be disposed in the light emitting areas LA1, LA2, and LA3 on the first substrate 110. In an embodiment, each of the first to third driving elements TR1, TR2, and TR3 may include at least one thin film transistor. Alternatively, each of the first to third driving elements TR1, TR2, and TR3 may further include a capacitor. A channel layer of the thin film transistor may include an oxide semiconductor, a silicon semiconductor, an organic semiconductor, or the like. In an embodiment, for example, the oxide semiconductor may include at least one selected from oxides of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like.

In an embodiment, a buffer layer (not shown) may be disposed between the first substrate 110 and the first to third driving elements TR1, TR2, and TR3. The buffer layer may prevent or reduce impurities such as oxygen or moisture from diffusing to an upper portion of the first substrate 110 through the first substrate 110. The buffer layer may include an inorganic insulating material such as a silicon compound, a metal oxide, or the like. In an embodiment, the inorganic insulating material of the buffer layer may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. These can be used alone or in a combination thereof. The buffer layer 120 may have a single-layered structure or a multi-layered structure including a plurality of insulating layers.

The insulating structure 120 may cover the first to third driving elements TR1, TR2, and TR3. The insulating structure 120 may include a combination of an inorganic insulating layer and an organic insulating layer. In an embodiment, for example, the inorganic insulating layer may include silicon oxide, silicon nitride, silicon carbide, silicon oxynitride, silicon oxycarbide, or the like, and the organic insulating layer may include a photoresist or polyacryl-based resin, polyimide-based resin, polyamide-based resin, siloxane-based resin, acryl-based resin, epoxy-based resin, or the like. Each of these may be used alone or in combination with each other.

First to third pixel electrodes ADE1, ADE2, and ADE3 may be disposed in each of the light emitting areas LA1, LA2, and LA3 on the insulating structure 120. Each of the first to third pixel electrodes ADE1, ADE2, and ADE3 may include a conductive material such as a metal, an alloy, a conductive metal nitride, a conductive metal oxide, or a transparent conductive material. Each of the first to third pixel electrodes ADE1, ADE2, and ADE3 may have a single-layer structure or a multi-layer structure including a plurality of conductive layers.

The first to third pixel electrodes ADE1, ADE2, and ADE3 may be electrically connected to the first to third driving elements TR1, TR2, and TR3 through contact holes defined or formed in the insulating structure 120, respectively.

The pixel defining layer 130 may be disposed on the first to third pixel electrodes ADE1, ADE2, and ADE3. The pixel defining layer 130 may include an organic insulating material. In an embodiment, the organic insulating material of the pixel defining layer 130 may include photoresist, polyacryl-based resin, polyimide-based resin, polyamide-based resin, siloxane-based resin, acrylic resin (acryl-based resin), epoxy-based resin, and the like. These may be used alone or in combination with each other. The pixel defining layer 130 may define a pixel opening exposing at least a portion of each of the first to third pixel electrodes ADE1, ADE2, and ADE3.

An emission layer EL may be disposed on the first to third pixel electrodes ADE1, ADE2, and ADE3 exposed by the pixel opening of the pixel defining layer 130. In an embodiment, the light emitting layer EL may extend continuously over a plurality of pixels. In an alternative embodiment, the emission layer EL may be separated from the emission layer of an adjacent pixel. The light emitting layer EL may include an organic light emitting material. In an embodiment, the light emitting layer EL may generate blue light.

In an embodiment, functional layers such as a hole injection layer, a hole transport layer, an electron transport layer, and an electron injection layer may be disposed on the upper and/or lower portions of the light emitting layer EL.

A common electrode CTE may be disposed on the emission layer EL. The common electrode CTE may include a conductive material such as a metal, an alloy, a conductive metal nitride, a conductive metal oxide, or a transparent conductive material. The common electrode CTE may have a single-layer structure or a multi-layer structure including a plurality of conductive layers. In an embodiment, the common electrode CTE may continuously extend across a plurality of pixels.

The first pixel electrode ADE1, the light emitting layer EL and the common electrode CTE may form the first light emitting element LED1, and the second pixel electrode ADE2, the light emitting layer EL and the common electrode CTE may form the second light emitting element LED2, and the third pixel electrode ADE3, the light emitting layer EL and the common electrode CTE may form the third light emitting element LED3. In an embodiment, the first light emitting element LED1 may be disposed in the first light emitting area LA1, the second light emitting element LED2 may be disposed in the second light emitting area LA2, and the third light emitting element LED3 may be disposed in the third light emitting area LA3.

The thin film encapsulation layer 140 may be disposed on the common electrode CTE. The thin film encapsulation layer 140 may prevent impurities, moisture from penetrating into the light emitting elements LED1, LED2, and LED3 from the outside. The thin film encapsulation layer 140 may include at least one inorganic encapsulation layer and at least one organic encapsulation layer. In an embodiment, for example, the inorganic encapsulation layer may include silicon oxide, silicon nitride, silicon oxynitride, or the like, and the organic encapsulation layer may include a cured polymer such as polyacrylate. In an embodiment, the thin film encapsulation layer 140 may include a first inorganic encapsulation layer disposed on the common electrode CTE, an organic encapsulation layer disposed on the first inorganic encapsulation layer, and a second inorganic encapsulation layer disposed on the organic encapsulation layer.

The bank 150 may be disposed in the display area DA on the thin film encapsulation layer 140. The bank 150 may define a plurality of openings. In an embodiment, for example, the bank 150 may define first to third openings OP1, OP2, and OP3 and an auxiliary opening OP-A. The first to third openings OP1, OP2, and OP3 and the auxiliary opening OP-A may be defined from a side surface of the bank 150 exposed through the bank 150. Each of the first to third openings OP1, OP2, and OP3 may be disposed in an area corresponding to the first to third light emitting areas LA1, LA2, and LA3. The auxiliary opening OP-A may be disposed in an area corresponding to the light blocking area BA. In an embodiment, the first opening OP1 may expose the first light emitting element LED1, the second opening OP2 may exposed the second light emitting element LED2, and the third opening OP3 may expose the third light emitting element LED3.

In a plan view, as shown in FIGS. 3 and 4, each of the first to third openings OP1, OP2, and OP3 may be repeatedly arranged along the row direction and the column direction. In an embodiment, each of the first to third openings OP1, OP2, and OP3 may be repeatedly arranged in the first direction D1 and the second direction D2 perpendicular to the first direction D1. In an embodiment, the bank 150 may define the plurality of auxiliary openings OP-A. Each of the plurality of auxiliary openings OP-A may have a different width and/or shape according to an arrangement position thereof.

In an embodiment, for example, the auxiliary opening OP-A may be positioned in a space between the first to third openings OP1, OP2, and OP3. At least one auxiliary opening OP-A may be defined or formed per unit area of the display device 1000 and may be repeatedly arranged. In such an embodiment, first to third light emitting areas LA1, LA2, and LA3 may be disposed in the unit area, and the unit area may be repeatedly arranged in the first direction D1 and the second direction D2 of the display device 1000.

In an embodiment, the bank 150 may include at least one partition wall 150-A. The partition wall 150-A may be disposed in the auxiliary opening OP-A. The partition wall 150-A may divide the auxiliary opening OP-A into a plurality of sub-openings. The partition wall 150-A may have various shapes to divide the auxiliary opening OP-A into the plurality of sub-openings.

In an embodiment, the first to third openings OP1, OP2, and OP3 may be a space for accommodating an ink composition or an organic composition in the process of forming a first color conversion pattern 162, a second color conversion pattern 164, and a light transmission pattern 166. The auxiliary opening OP-A may be a space for accommodating the ink composition that has been incorrectly deposited when the ink composition is ejected to the outside of the target opening (hereinafter, misplaced) in the process of ejecting the ink composition by an inkjet printing. In an embodiment, for example, the first color conversion pattern 162 may be disposed in the first opening OP1, the second color conversion pattern 164 may be disposed in the second opening OP2, and the light transmission pattern may be disposed in the third opening OP3.

In an embodiment, the first opening OP1, the second opening OP2, and the third opening OP3 may have different sizes from each other. In an embodiment, a size of the third opening OP3 in which the light transmission pattern 166 is disposed may be smaller than a size of the first opening OP1 in which the first color conversion pattern 162 is disposed, and a size of the second opening OP3 in which the second color conversion pattern 164 is disposed. In such an embodiment, the size of the second opening OP2 may be larger than the width of the first opening OP1. However, this is only an example, and each size of the first to third openings OP1, OP2, and OP3 may be variously modified.

In an embodiment, the side surface of the bank 150 exposed through the bank 150 may be perpendicular to the thin film encapsulation layer 140 and the upper surface of the bank 150. Accordingly, the cross-sections of the first to third openings OP1, OP2, and OP3 and the auxiliary opening OP-A may have a rectangular shape. However, the invention is not limited thereto, and in an alternative embodiment, the side surface of the bank 150 exposed through the bank 150 may be inclined toward the upper surface of the bank 150. Accordingly, the cross-sections of the first to third openings OP1, OP2, and OP3 and the auxiliary opening OP-A may have a trapezoidal shape.

The bank 150 may include an organic material. In an embodiment, the bank 150 may further include a light blocking material. In an embodiment, for example, at least a portion of the bank 150 may include a light blocking material such as black pigment, dye, carbon black, or the like.

The color conversion layer 160 may be disposed on the thin film encapsulation layer 140. The color conversion layer 160 may be surrounded by the bank 150. In an embodiment, the color conversion layer 160 may convert light emitted from the first to third light emitting elements LED1, LED2, and LED3 into light having a specific wavelength. In an embodiment, for example, the color conversion layer 160 may include color conversion particles.

The color conversion layer 160 may include the first color conversion pattern 162, the second color conversion pattern 164, and the light transmission pattern 166. The first color conversion pattern 162, the second color conversion pattern 164, and the light transmission pattern 166 may overlap the first to third light emitting areas LA1, LA2, and LA3, respectively. In an embodiment, for example, the first color conversion pattern 162, the second color conversion pattern 164, and the light transmission pattern 166 may be disposed in each of the first to third openings OP1, OP2, and OP3 defined by the bank 150.

The first color conversion pattern 162 may overlap the first light emitting area LA1. In an embodiment, for example, the first color conversion pattern 162 may be disposed in the first opening OP1. The first color conversion pattern 162 may convert the incident light L1 of the first wavelength emitted from the first light emitting element LED1 into the first transmitted light Lr of the second wavelength. In an embodiment, the incident light L1 of the first wavelength may be blue light having a maximum emission peak wavelength in a range of about 380 nanometers (nm) to about 480 nm, and the first transmitted light Lr of the second wavelength may be red light having a maximum emission peak wavelength in a range of about 500 nm to about 500 nm. In an embodiment, for example, the first color conversion pattern 162 may include a first photosensitive polymer, first scattering particles, and first color conversion particles.

The first scattering particles may scatter the incident light L1 to increase a light path without substantially changing the wavelength of the incident light L1 incident on the first color conversion pattern 162. The first scattering particles may include a metal oxide. In an embodiment, the metal oxide of the first scattering particles may include at least one selected from $TiO_2$, $ZrO_2$, $Al_2O_3$, $In_2O_3$, ZnO, $SnO_2$, $Sb_2O_3$, and indium tin oxide (ITO). These may be used alone or in combination with each other. Alternatively, the first scattering particles may be omitted.

In an embodiment, the first color conversion particles may include quantum dots. The quantum dots may be defined as semiconductor materials having nanocrystals. The quantum dots may have a specific bandgap according to their composition and size. Accordingly, the quantum dots may absorb the incident light L1 and emit light having a wavelength different from that of the incident light L1. In an embodiment, for example, the quantum dots may have a diameter of about 100 nm or less, e.g., a diameter in a range of about 1 nm to about 20 nm. In an embodiment, for example, the first color conversion particles of the first color conversion pattern 162 may include quantum dots that absorb blue light and emit red light.

The first scattering particles and the first color conversion particles may be dispersed in the first photosensitive polymer. In an embodiment, for example, the photosensitive polymer may include an epoxy-based resin, an acrylic resin, a phenol-based resin, a melamine-based resin, a cardo-based resin, an imide-based resin, or the like.

The first color conversion pattern 162 may convert the incident light L1 to emit the first transmitted light Lr. The incident light L1 that is not converted by the first color conversion pattern 162 may be blocked by the first color filter 221. Accordingly, in the first light emitting area LA1, the first transmitted light Lr of the second wavelength may pass through the second substrate 210 to be emitted to the outside (i.e., in the third direction D3).

The second color conversion pattern 164 may overlap the second light emitting area LA2. In an embodiment, for example, the second color conversion pattern 164 may be disposed in the second opening OP2. The second color conversion pattern 164 may convert the incident light L1 of the first wavelength emitted from the second light emitting element LED2 into the second transmitted light Lg of the third wavelength. In an embodiment, the incident light L1 of the first wavelength may be blue light having a maximum emission peak wavelength in a range of about 380 nm to about 480 nm, and the second transmitted light Lg of the third wavelength may be green light having a maximum emission peak wavelength in a range of about 600 nm to about 650 nm. In an embodiment, for example, the second color conversion pattern 164 may include a second photosensitive polymer, second scattering particles, and second color conversion particles. In an embodiment, the second photosensitive polymer and the first photosensitive polymer may include a same material as each other, and the second scattering particles and the first scattering particles may include a same material as each other.

In an embodiment, the second color conversion particles may include quantum dots that absorb blue light and emit green light. Accordingly, the second color conversion pattern 164 may convert the incident light L1 to emit the second transmitted light Lg. The incident light L1 that is not converted by the second color conversion pattern 164 may be blocked by the second color filter 222. Accordingly, in the second light emitting area LA2, the second transmitted light Lg of the third wavelength may pass through the second substrate 210 and be emitted to the outside (i.e., in the third direction D3).

The light transmission pattern 166 may overlap the third light emitting area LA3. In an embodiment, for example, the light transmission pattern 166 may be disposed in the third opening OP3. The light transmission pattern 166 may transmit the incident light L1 of the first wavelength emitted from the third light emitting element LED3 without any conversion. In an embodiment, the incident light L1 of the first wavelength may be blue light having a maximum emission peak wavelength in a range of about 380 nm to about 480 nm. That is, the light transmission pattern 166 may emit the third transmitted light Lb having substantially the same wavelength as the incident light L1. Accordingly, in the third light emitting area LA3, the third transmitted light Lb may pass through the second substrate 210 and be emitted to the outside (i.e., in the third direction D3). In an embodiment, for example, the light transmission pattern 166 may include a third photosensitive polymer and third scattering particles. In an embodiment, the third photosensitive polymer and the first photosensitive polymer may include a same material as each other, and the third scattering particles and the first scattering particles may include a same material as each other.

In an embodiment, a content of the third scattering particles included in the light transmission pattern 166 may be in a range of about 1 wt % to about 10 wt % based on the total weight of the light transmission pattern 166. In an embodiment, the content of the third scattering particles included in the light transmission pattern 166 may be in a range of about 5 wt % to about 10 wt % based on the total weight of the light transmission pattern 166. In such an embodiment where the content of the third scattering particles is the above range, a light efficiency of the display device 1000 may be further improved.

According to embodiments, as the color conversion layer 160 is included in the lower substrate 100 and is directly disposed on the thin film encapsulation layer 140, a gap between the light emitting elements LED1, LED2, LED3 and the color conversion layer 160 may be reduced. Accordingly, the density of the incident light L1 incident on the color conversion layer 160 may increase, the conversion rate of the incident light L1 may increase, and the light efficiency of the display device 1000 may be improved. Accordingly, the display quality of the display device 1000 may be improved.

In an embodiment, the light transmission pattern 166 may be disposed to contact the upper surface of the bank 150. In such an embodiment, a step (or a stepped structure) may be formed or defined in or by a portion of the light transmission pattern 166 that is in contact with the upper surface of the bank 150.

The column spacer 170 may be disposed on the bank 150. In an embodiment, the column spacer 170 may be disposed to be spaced apart from the second opening OP2 in the first direction D1 in a plan view. However, the invention is not limited thereto, and the column spacer 170 may be disposed to be spaced apart from the second opening OP2 in the second direction D2, or may be disposed to be spaced apart from the second opening OP2 and/or the first opening OP1 in the first direction D1. In an embodiment, at least one column spacer 170 may be disposed or formed at least one of the unit areas of the display device 1000, and may not be disposed or formed in some of the unit areas. An area in which the column spacer 170 is disposed in the bank 150 may be adjusted in size and shape to provide a space in which the column spacer 170 is disposed. In some embodiments, the display device 1000 may include the column spacer 170 to maintain a substantially constant gap between the lower substrate 100 and the upper substrate 200. In an embodiment, where the step is formed by the light transmission pattern 166, the column spacer may compensate for the step.

In an embodiment, the column spacer 170 may have a same composition as the light transmission pattern 166. In such an embodiment, the column spacer 170 may include the third photosensitive polymer and the third scattering particles. In an embodiment, the content of the third scattering particles included in the column spacer 170 may be in a range of about 1 wt % to about 10 wt % based on the total weight of the column spacer 170. Specifically, the content of the third scattering particles included in the column spacer 170 may be in a range of about 5 wt % to about 10 wt % based on the total weight of the column spacer 170.

In an embodiment, the light transmission pattern 166 and the column spacer 170 may be simultaneously formed through a single process. For example, the light transmission pattern 166 and the column spacer 170 may be formed through a single exposure and development process using one exposure mask. Accordingly, the efficiency of the process of the display device 1000 may be improved, and the manufacturing cost of the display device 1000 may be reduced. This will be described in more detail later in the description of the method of manufacturing the display device 1000.

The compensation pattern 180 may be disposed in the light blocking area BA. In an embodiment, the compensation pattern 180 may be disposed in the auxiliary opening OP-A. In one embodiment, as shown in FIG. 5, the compensation pattern 180 may be spaced apart from the upper surface of the bank 150 while being disposed in the auxiliary opening OP-A. Specifically, the compensation pattern 180 may be disposed in the plurality of sub-openings. However, the invention is not limited thereto, as shown in FIG. 6, in another embodiment, the compensation pattern 180 may be disposed in the auxiliary opening OP-A so that a portion of the compensation pattern 180 is in contact with the upper surface of the bank 150. In this case, the compensation pattern 180 may be disposed to be spaced apart from the light transmission pattern 166 on upper surface of the bank 150. However, the invention is not limited thereto, and in another embodiment, the compensation pattern 180 may be disposed to contact the light transmitting pattern 166 on the upper surface of the bank 150.

Referring to FIGS. 4 and 5 again, as described above, as the auxiliary opening OP-A is a space for accommodating ink composition that is misplaced in the process of performing the inkjet printing process, after the inkjet printing process, the auxiliary opening OP-A may be left as unnecessary surplus space. Accordingly, in the process of bonding the upper substrate 200 and the lower substrate 100, the surplus space may be required to be filled with a filler or the like. According to the embodiments, as the compensation pattern 180 is disposed in the auxiliary opening OP-A, the surplus space due to the auxiliary opening OP-A may be minimized. Accordingly, the amount of the filler used for filling the surplus space may be reduced, and the manufacturing cost of the display device 1000 may be further reduced.

In an embodiment, the compensation pattern 180 may have the same composition as the light transmission pattern 166 and the column spacer 170. That is, the compensation pattern 180 may include the third photosensitive polymer and the third scattering particles. In an embodiment, the content of the third scattering particles included in the compensation pattern 180 may be in a range of about 1 wt % to about 10 wt % based on the total weight of the compensation pattern 180. In an embodiment, for example, the content of the third scattering particles included in the compensation pattern 180 may be in a range of about 5 wt % to about 10 wt % based on the total weight of the compensation pattern 180.

In an embodiment, the light transmission pattern 166, the column spacer 170, and the compensation pattern 180 may be simultaneously formed through a same process. In an embodiment, for example, the light transmission pattern 166, the column spacer 170, and the compensation pattern 180 may be formed through a same exposure and development process using a single exposure mask. Accordingly, the efficiency of the process of the display device 1000 may be improved, and the manufacturing cost of the display device 1000 may be reduced. This will be described in greater detail later in the description of the method of manufacturing the display device 1000.

The upper substrate 200 may be disposed in the third direction D3 from the lower substrate 100. In an embodiment, the upper substrate 200 may include a second substrate 210, a color filter layer 220, and a refractive layer 230.

The second substrate 210 may be an insulating substrate including or formed of a transparent material. The second substrate 210 may include glass or plastic. The second substrate 210 may include the above-described light emitting areas LA1, LA2, and LA3 and the light blocking area BA.

The color filter layer 220 may be disposed under the second substrate 210.

The color filter layer 220 may include the first color filter 221, the second color filter 222, and the third color filter 223. In an embodiment, the first color filter 221, the second color filter 222, and the third color filter 223 may selectively transmit light having different wavelengths from each other. In an embodiment, for example, the first color filter 221 may overlap the first light emitting area LA1, and may transmit the light of the second wavelength (or red light), and block the light of the first wavelength (or blue light) and the light of the second wavelength (or green light). The second color filter 222 may overlap the second light emitting area LA2, and may transmit the light of the third wavelength, and block the light of the first wavelength and the light of the second wavelength. The third color filter 223 may overlap the light emitting area LA3, and may transmit the light of the first wavelength, and block the red light of the second wavelength and the light of the third wavelength.

In an embodiment, each of the first color filter 221, the second color filter 222, and the third color filter 223 may be disposed to further overlap the light blocking area BA. In an embodiment, as shown in FIG. 5, the first color filter 221 may overlap the first light emitting area LA1 and the light blocking area BA, but may not overlap the second light emitting area LA2 and the third light-emitting area LA3. The second color filter 222 may overlap the second light emitting area LA2 and the light-blocking area BA, but may not overlap the first light emitting area LA1 and the third light-emitting area LA3. The third color filter 223 may overlap the third light emitting area LA3 and the light-blocking area BA, but may not overlap the first light emitting area LA1 and the second light emitting area LA2. In such an embodiment, in the light blocking area BA, some portions of the first to third color filters 221, 222, and 223 may overlap each other in the third direction D3. Accordingly, color mixing between the adjacent first to third light emitting areas LA1, LA2, and LA3 may be effectively prevented.

The refractive layer 230 may be disposed under the color filter layer 220. The refractive layer 230 may cover the color filter layer 220. The refractive layer 230 may adjust a propagation path or direction of the light incident from the bottom to be directed in the third direction D3. In an embodiment, the refractive layer 230 may have a relatively lower refractive index than the layers adjacent thereto or located in the vicinity thereof. In an embodiment, the refractive layer 230 may be formed using an organic material.

In an embodiment, an inorganic layer (not shown) may be disposed on the upper and lower portions of the refractive layer 230. The inorganic layer may cover the refractive layer 230. The inorganic layer may include silicon oxide, silicon nitride, silicon carbide, silicon oxynitride, silicon oxycarbide, or the like. These may be used alone or in combination with each other.

The filling layer 300 may be disposed between the lower substrate 100 and the upper substrate 200. The filling layer 300 may act as a buffer against external pressure applied to the display device 1000. In an embodiment, for example, the filling layer 300 may maintain a gap between the lower substrate 100 and the upper substrate 200. The filling layer 300 may include a material capable of transmitting light. In an embodiment, for example, the filling layer 300 may include an organic material. In an embodiment, the material of the filling layer 300 may include at least one selected from a silicone-based resin, an epoxy-based resin, and the like. These may be used alone or in combination with each other.

FIGS. 7 to 13 are views illustrating an embodiment of a method of manufacturing the display device of FIG. 1.

Figure 7:
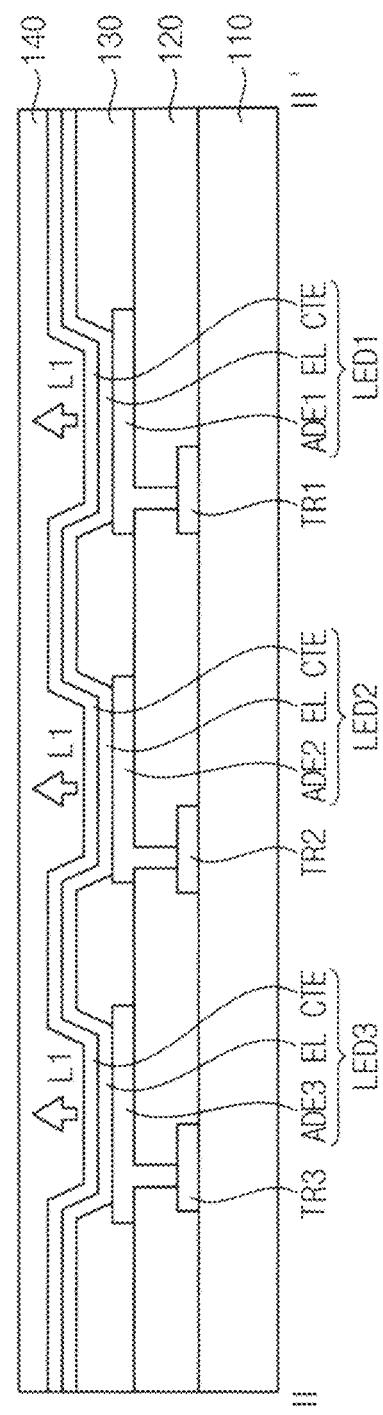
FIGS. 7 to 13 are views illustrating an embodiment of a method of manufacturing the display device of FIG. 1.

Referring to FIG. 7, in an embodiment of a method of manufacturing the display device, the first to third driving elements TR1, TR2, and TR3 and the insulating structure 120 may be formed (or provided) on the first substrate 110. The insulating structure 120 may be formed to cover the first to third driving elements TR1, TR2, and TR3. Thereafter, the first to third pixel electrodes ADE1, ADE2, and ADE3 may be provided or formed on the insulating structure 120. Each of the first to third pixel electrodes ADE1, ADE2, and ADE3 may be electrically connected to the first to third driving elements TR1, TR2, and TR3 respectively through contact holes formed in the insulating structure 120. Thereafter, the pixel defining layer 130 may be formed on the insulating structure 120 on which the first to third pixel electrodes ADE1, ADE2, and ADE3 are formed. The pixel defining layer 130 may have the pixel opening exposing the first to third pixel electrodes ADE1, ADE2, and ADE3. Subsequently, the emission layer EL may be formed on the first to third pixel electrodes ADE1, ADE2, and ADE3 exposed by the pixel opening of the pixel defining layer 130. In an embodiment, the light emitting layer EL may extend continuously over a plurality of pixels. Thereafter, the common electrode CTE may be formed on the emission layer EL. In an embodiment, the common electrode CTE may extend continuously over a plurality of pixels. The first to third pixel electrodes ADE1, ADE2, and ADE3, the emission layer EL and the common electrode CTE may form or define the first to third light emitting elements LED1, LED2, and LED3. Thereafter, the thin film encapsulation layer 140 may be formed on the first to third light emitting elements LED1, LED2, and LED3.

Figure 8:
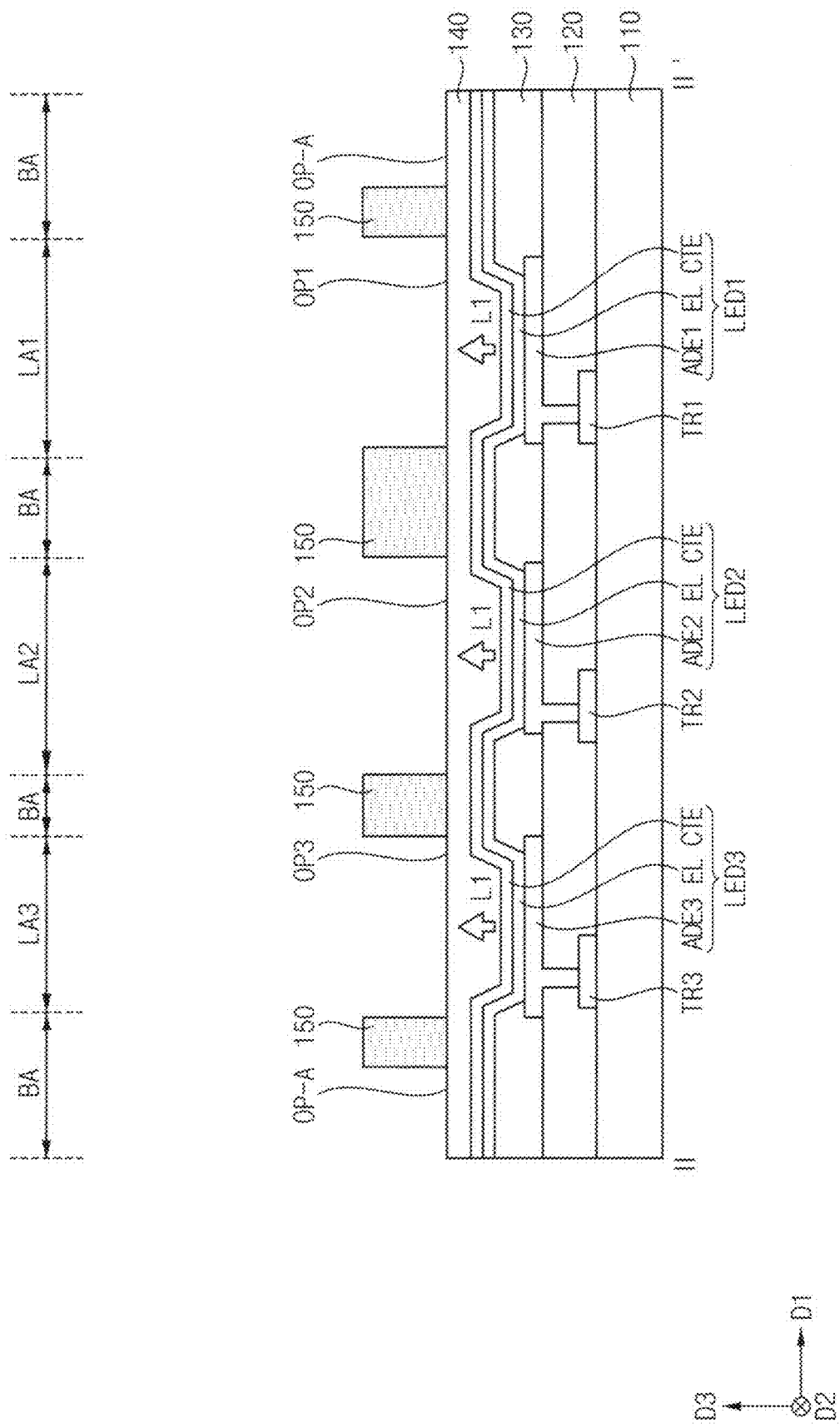

Referring to FIG. 8, the bank 150 may be formed on the thin film encapsulation layer 140. Thereafter, the first to third openings OP1, OP2, and OP3 and the auxiliary opening OP-A may be formed in the bank 150. The first to third openings OP1, OP2, and OP3 may expose the first to third light emitting elements LED1, LED2, and LED3, respectively. The auxiliary opening OP-A may be formed in an area corresponding to the light blocking area BA. In such an embodiment, the first to third openings OP1, OP2, OP3 and the auxiliary opening OP-A may be defined by the side surfaces of the bank 150 exposed through the bank 150.

Figure 9:
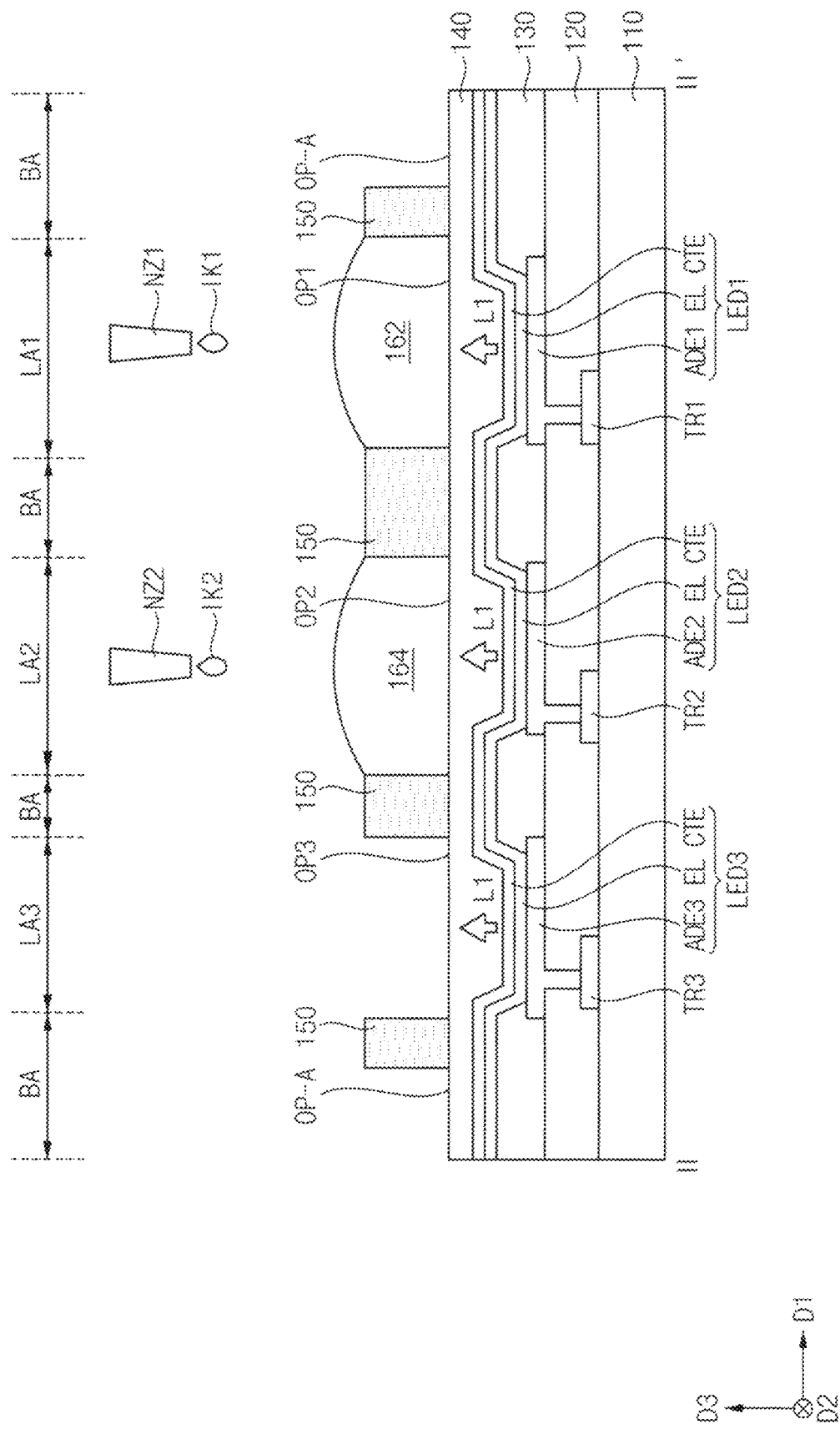
Figure 10:
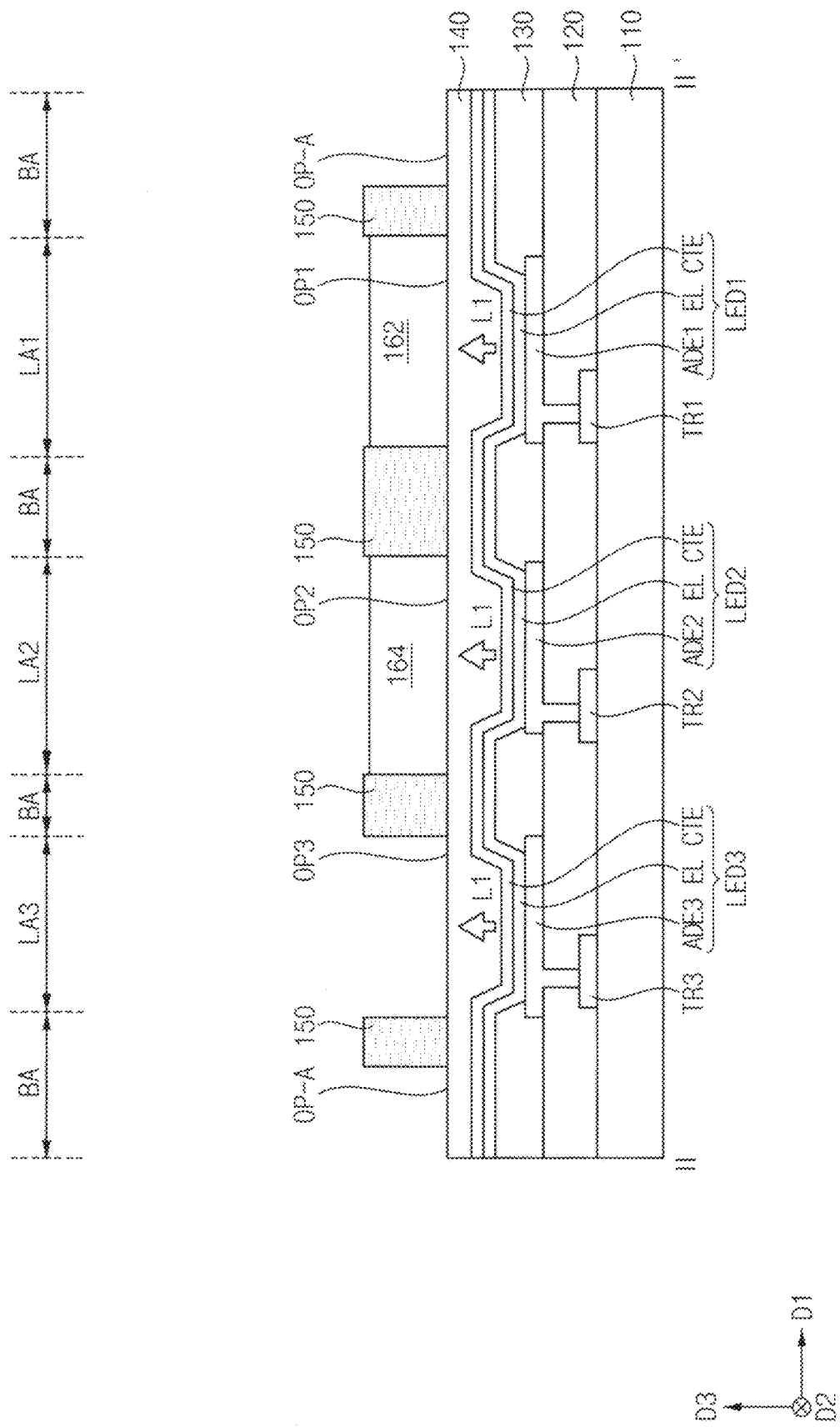

Referring to FIGS. 9 and 10, the first color conversion pattern 162 may be formed in the first opening OP1 of the bank 150 and the second color conversion pattern 164 may be formed in the second opening OP2 of the bank 150. In an embodiment, the first color conversion pattern 162 and the second color conversion pattern 164 may be formed using an inkjet printing process. In an embodiment, for example, the first color conversion pattern 162 may be formed by spraying the first ink composition IK1 into the first opening OP1 through the first nozzle NZ1 of an inkjet printing apparatus. Here, the first ink composition IK1 may be a material for forming the first color conversion pattern 162. In addition, the second color conversion pattern 164 may be formed by spraying the second ink composition IK2 into the second opening OP2 through the second nozzle NZ2 of the inkjet printing apparatus. Here, the second ink composition IK2 may be a material for forming the second color conversion pattern 164. Subsequently, the first color conversion pattern 162 and the second color conversion pattern 164 may be cured. Accordingly, the first color conversion pattern 162 and the second color conversion pattern 164 may be contracted. However, the method of forming the first color conversion pattern 162 and the second color conversion pattern 164 is not limited thereto, and alternatively, the first color conversion pattern 162 and the second color conversion pattern 164 may be formed through exposure and development processes after the photosensitive material for the conversion pattern is applied.

Figure 11:
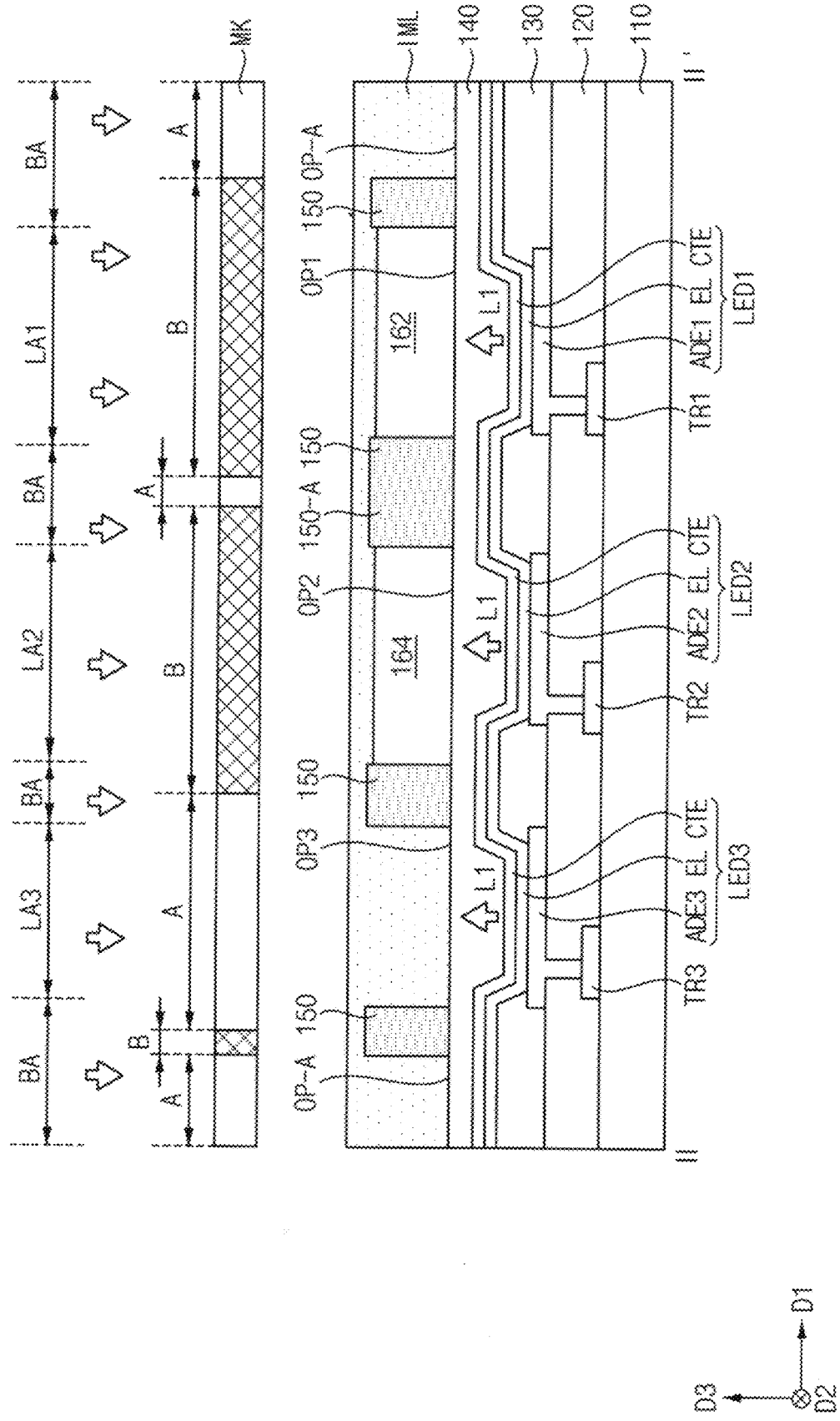
Figure 12:
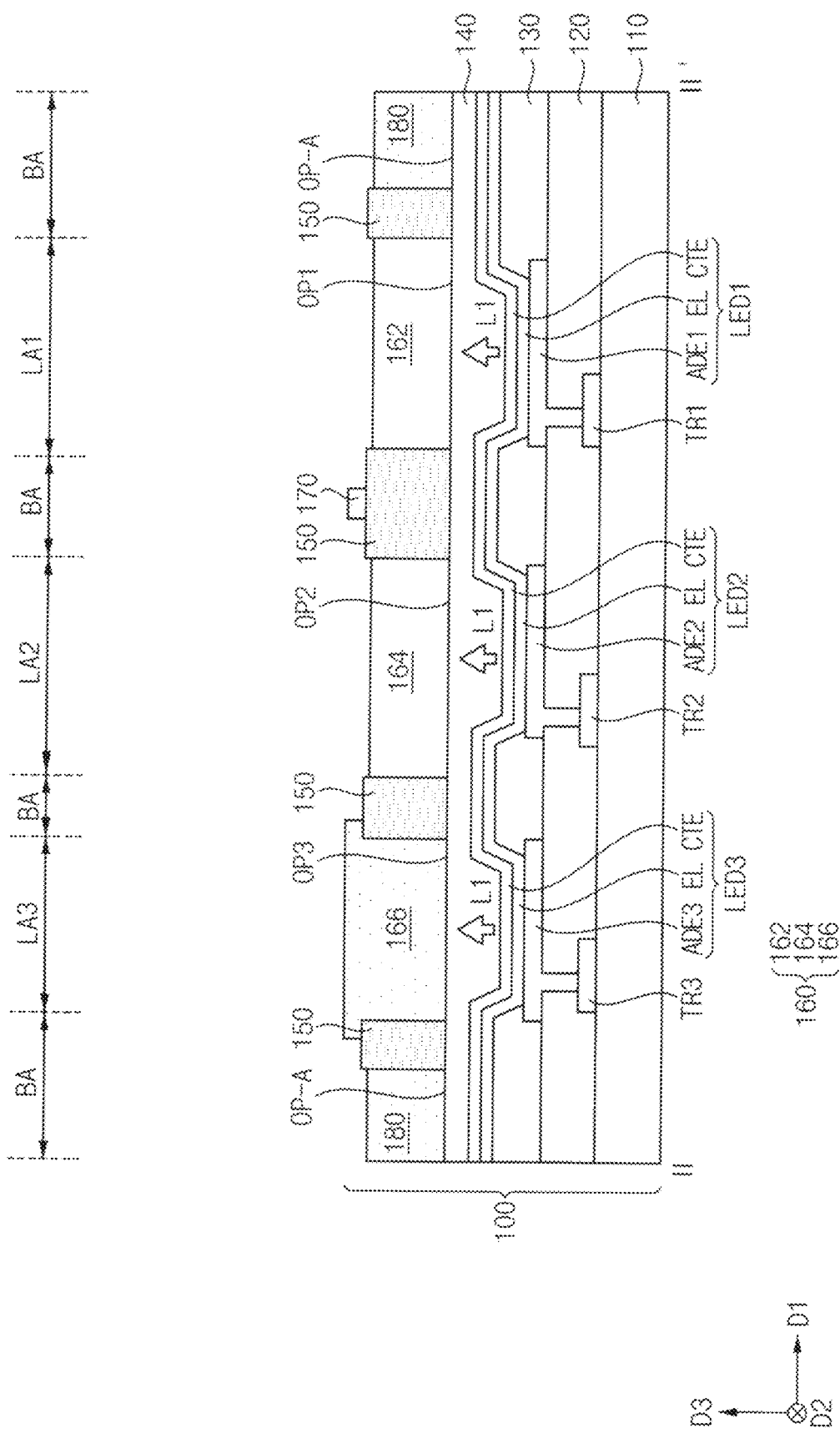

Referring to FIGS. 11 and 12, an organic material layer IML, covering the bank 150, the first color conversion pattern 162 and the second color conversion pattern 164 and filling the third opening OP3 and the auxiliary filling the opening OP-A may be formed on the thin film encapsulation layer 140. The organic material layer IML, may include the third photosensitive material and the third scattering particles. Accordingly, the organic material layer IML may have photosensitivity. Thereafter, a remaining area of the organic material layer IML except for areas corresponding to (or overlapping) the third opening OP3 and the auxiliary opening OP-A may be removed. In an embodiment, for example, by using an exposure mask MK having a first area A and the second area B having different light transmittances from each other, the remaining area of the organic material layer IML except for areas corresponding to the third opening OP3 and the auxiliary opening OP-A may be removed. In an embodiment, for example, the first area A may be a transmissive area through which a light from the exposure machine is transmitted, and the second area B may be a non-transmissive area that blocks the light from the exposure machine. That is, the remaining area of the organic material layer IML except for areas corresponding to the third opening OP3 and the auxiliary opening OP-A may be removed through an exposure and development process.

In an embodiment, the first area A may be an area where the organic material layer IML is removed, and the second area B may be an area where the organic material layer IML remains. That is, as shown in FIG. 12, an area corresponding to the first area A of the organic material layer IML may remain through the exposure and development process using the exposure mask MK, and an area corresponding to the second area B may be removed to form the light transmission pattern 166, the column spacer 170, and the compensation pattern 180. In an embodiment, for example, the light transmission pattern 166 may be formed in the third opening OP3, the column spacer 170 may be formed on the bank 150, and the compensation pattern 180 may be formed in the auxiliary opening OP-A. In an embodiment, the light transmission pattern 166 may be formed to contact the upper surface of the bank 150 by setting a width and/or a light transmission degree of the area of the exposure mask MK corresponding to the third opening OP3. In an embodiment, the compensation pattern 180 may be formed to be spaced apart from the upper surface of the bank 150 by controlling the remaining thickness of the area of the organic material layer IML corresponding to the auxiliary opening OP-A. However, the invention is not limited thereto, and in an alternative embodiment, the compensation pattern 180 may be formed in a way such that a portion of the compensation pattern 180 is in contact with the upper surface of the bank 150 by setting a width and/or a light transmission degree of the area of the exposure mask MK corresponding to the auxiliary opening OP-A.

According to embodiments, the light transmission pattern 166, the column spacer 170, and the compensation pattern 180 may be simultaneously formed through a same process using the single exposure mask MK, and using a same composition. Accordingly, the efficiency of the process of the display device 1000 may be improved, and the manufacturing cost may be reduced.

In embodiments, as described above, the third photosensitive material may be a negative photosensitive material, but the invention is not limited thereto, and in alternative embodiments, the third photosensitive material may be a positive photosensitive material. In such embodiments, in the exposure mask MK, transmittances of the areas corresponding to the first area A and the second area B may be opposite to those described above.

Figure 13:
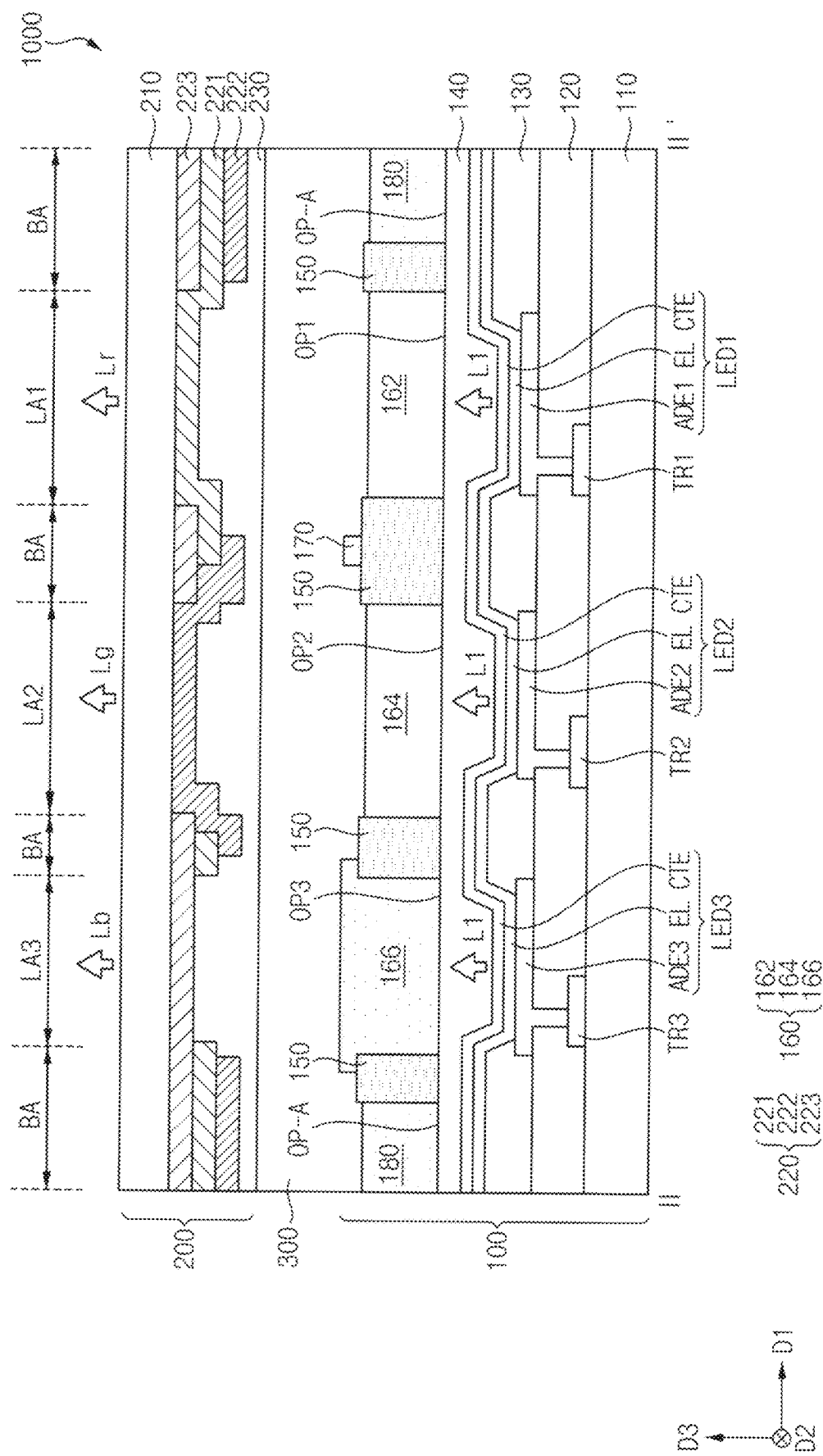

Referring to FIG. 13, the filling layer 300 may be coated on the bank 150, the color conversion layer 160, the column spacer 170 and the compensation pattern 180, and the lower substrate 100 and the upper substrate 200 may be bonded to each other. A method of manufacturing the upper substrate 200 bonded to the lower substrate 100 will hereinafter be described.

The color filter layer 220 including the first color filter 221, the second color filter 222, and the third color filter 223 may be formed on the upper substrate 200. The first color filter 221, the second color filter 222, and the third color filter 223 may be sequentially formed. Thereafter, the refractive layer 230 may be formed on the color filter layer 220. The refractive layer 230 may cover the color filter layer 220. The refractive layer 230 may have a relatively lower refractive index than the color filter layer 220. In an embodiment, for example, the refractive layer 230 may have a refractive index of about 1.4 or less. In an embodiment, the refractive layer 230 may be formed using an organic material.

According to embodiments, as described above, by forming the light transmission pattern 166 through the exposure and development processes, in the inkjet printing process for forming the first color conversion pattern 162 and the second color conversion pattern 164, a separate inkjet nozzle and ink for forming the light transmission pattern 166 may not be prepared. Accordingly, cost or time for a separate inkjet printing process for forming the light transmission pattern 166 may be saved.

In such embodiments, the efficiency of a process for manufacturing the high-resolution display device 1000 may be improved. When the resolution of the display device 1000 is improved, the opening of the bank 150 corresponding to the third light emitting area LA3 may be desired to have a relatively smaller width than other openings. When the light transmission pattern 166 is formed through the exposure and development process, it may be easier to form the light transmission pattern 166 in an opening having a relatively small width. Accordingly, in an embodiment of the manufacturing process of the high-resolution display device 1000, the efficiency of the process of forming the light transmission pattern 166 may be further improved. Accordingly, the display quality of the display device 1000 may be further improved.

In such embodiments, since the light transmission pattern 166, the column spacer 170, and the compensation pattern 180 are simultaneously formed through a same process using the single exposure mask MK without using an additional exposure and development process for forming the column spacer 170 and the compensation pattern 180. Accordingly, the efficiency of the process of the display device 1000 may be improved, and the manufacturing cost may be reduced.

Figure 14:
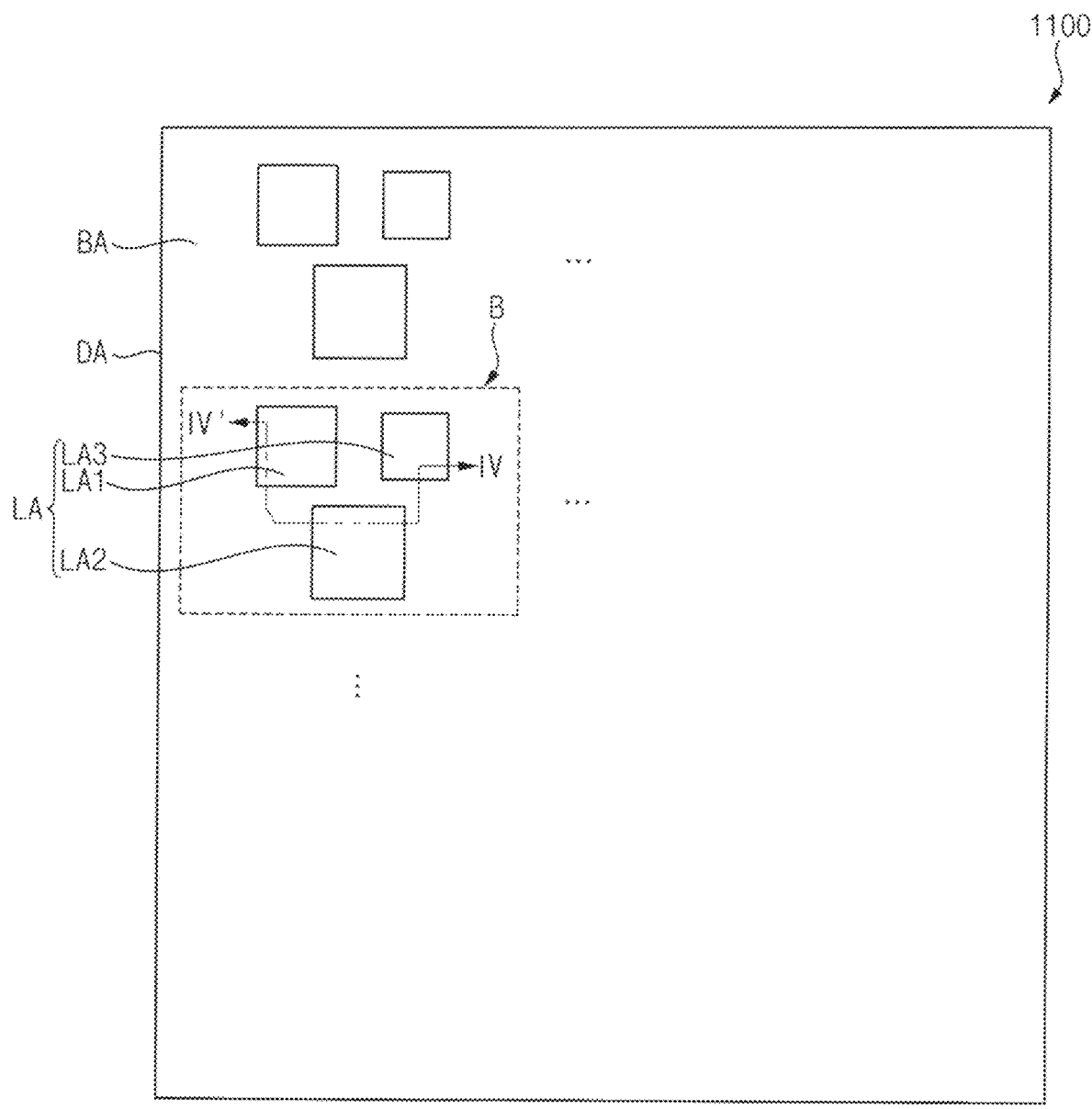
FIG. 14 is a plan view illustrating a display device according to an alternative embodiment.
Figure 15:
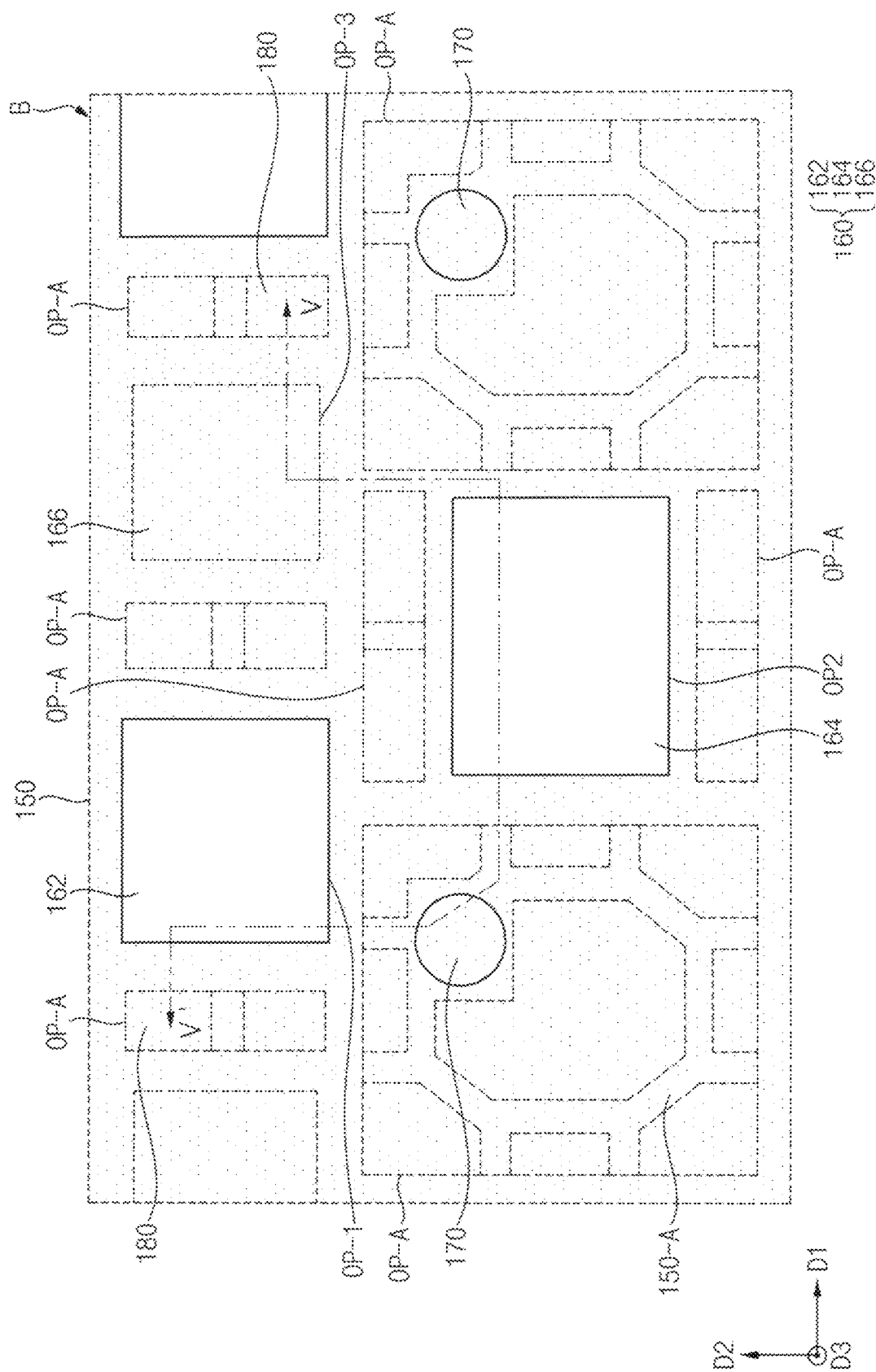
FIG. 15 is an enlarged plan view of a lower substrate of region 'B' of the display device of FIG. 14.
Figure 16:
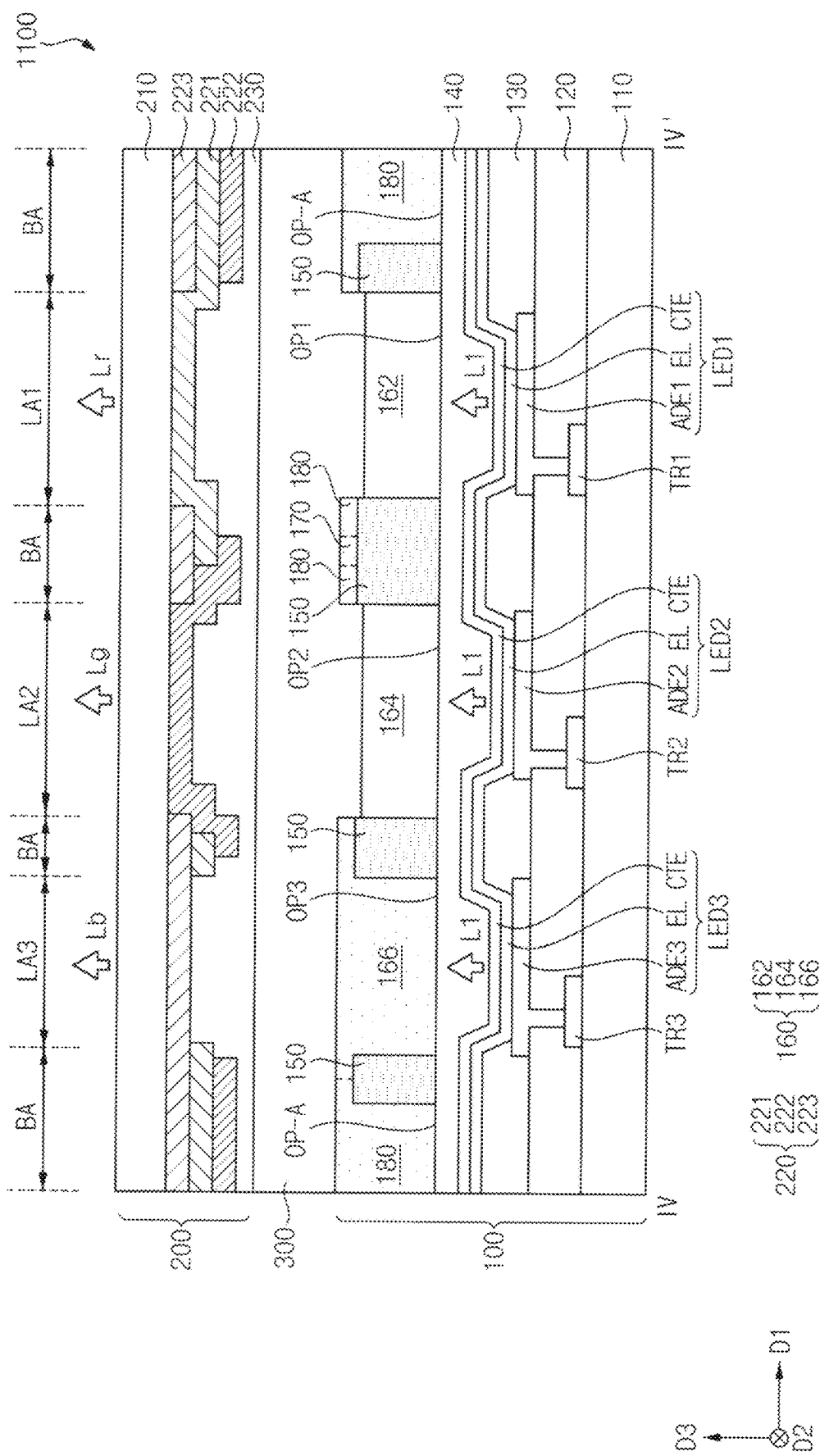
FIG. 16 is a cross-sectional view taken along line IV-IV' of FIG. 14.

FIG. 14 is a plan view illustrating a display device according to an alternative embodiment, FIG. 15 is an enlarged plan view illustrating a lower substrate of region 'B' of the display device of FIG. 14, and FIG. 16 is a cross-sectional view taken along line IV-IV' of FIG. 14.

Particularly, the cross-section of the lower substrate 100 shown in FIG. 16 may correspond to the cross-section taken along line V-V of FIG. 15.

An embodiment of the display device shown in FIGS. 14 to 16 may be substantially the same as the embodiments of the display device 1000 described above with reference to FIGS. 1 to 13, except for the area where the compensation pattern 180 is disposed.

In an embodiment, the compensation pattern 180 may be disposed all areas except for areas corresponding to the first color conversion pattern 162, the second color conversion pattern 164, and the light transmission pattern 166, and the column spacer 170. In such an embodiment, the compensation pattern 180 may be integrated or integrally formed with the light transmitting pattern 166 and the column spacer 170 as a single unitary and indivisible part on the bank 150. In an embodiment, for example, in the process of forming the light transmission pattern 166, the column spacer 170, and the compensation pattern 180 described above with reference to FIGS. 11 and 12, by adjusting the arrangement characteristics of the first area A and the second area B of the exposure mask 1\4K, the area corresponding to the first color conversion pattern 162 and the area corresponding to the second color conversion pattern 164 of the organic material layer IML may be removed, and all remaining areas may remain. Accordingly, the light transmission pattern 166, the column spacer 170, and the compensation pattern 180 may be integrally formed with each other on the upper surface of the bank 150. In such an embodiment, the upper surface of the bank 150 may be covered by the light transmission pattern 166, the column spacer 170, and the compensation pattern 180.

Figure 17:
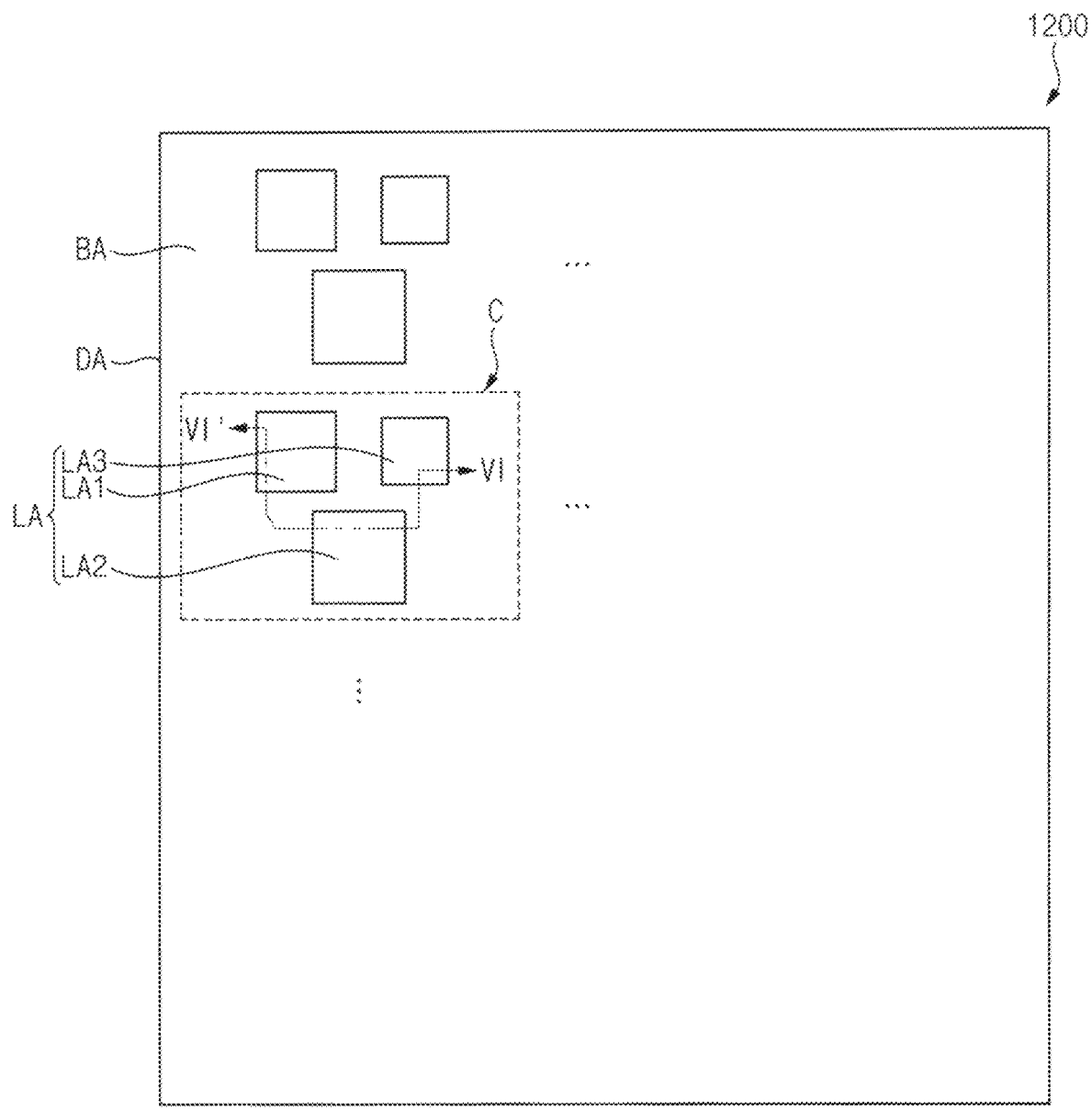
FIG. 17 is a plan view illustrating a display device according to another alternative embodiment.
Figure 18:
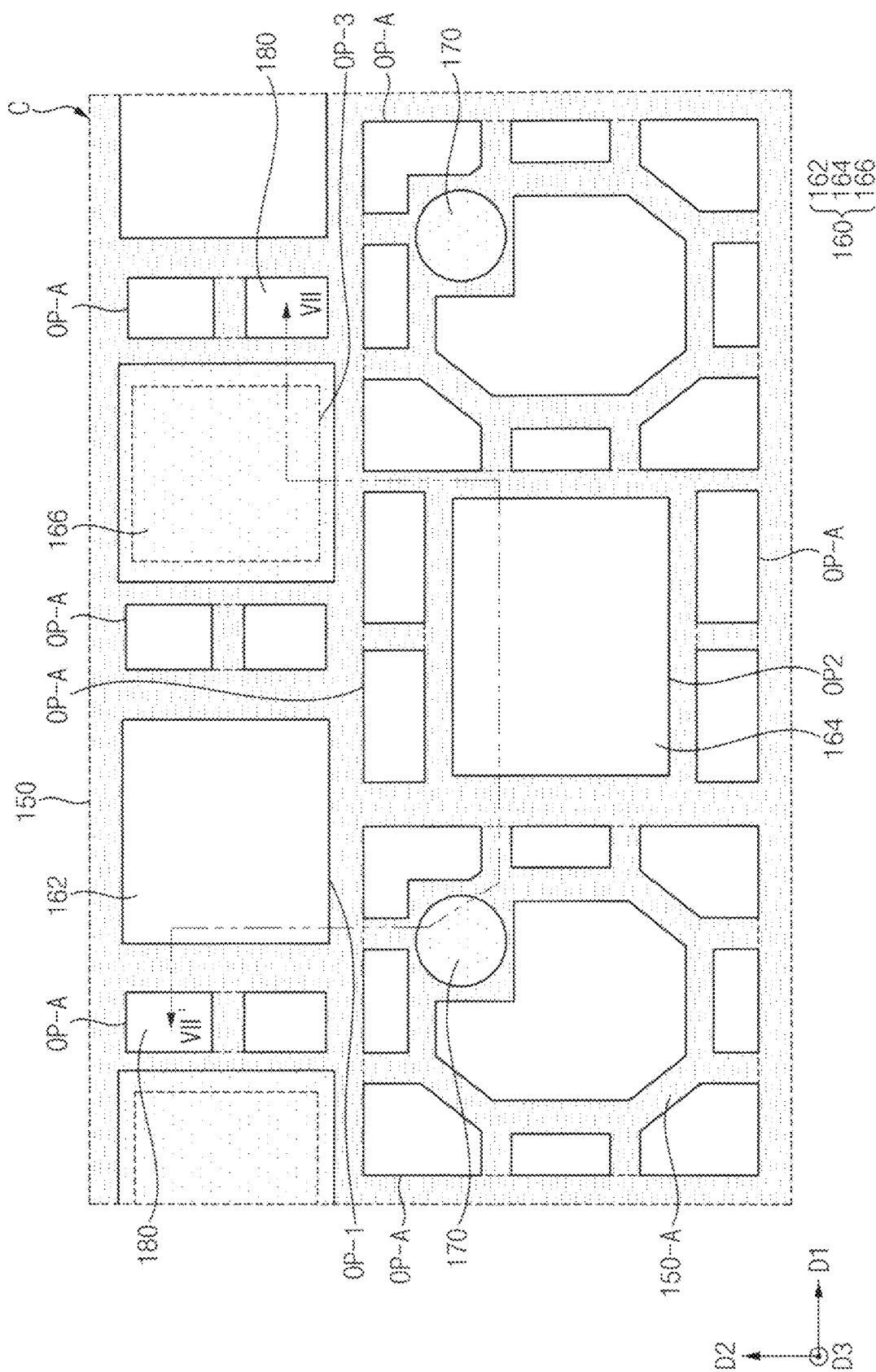
FIG. 18 is an enlarged plan view of a lower substrate of region 'C' of the display device of FIG. 17.
Figure 19:
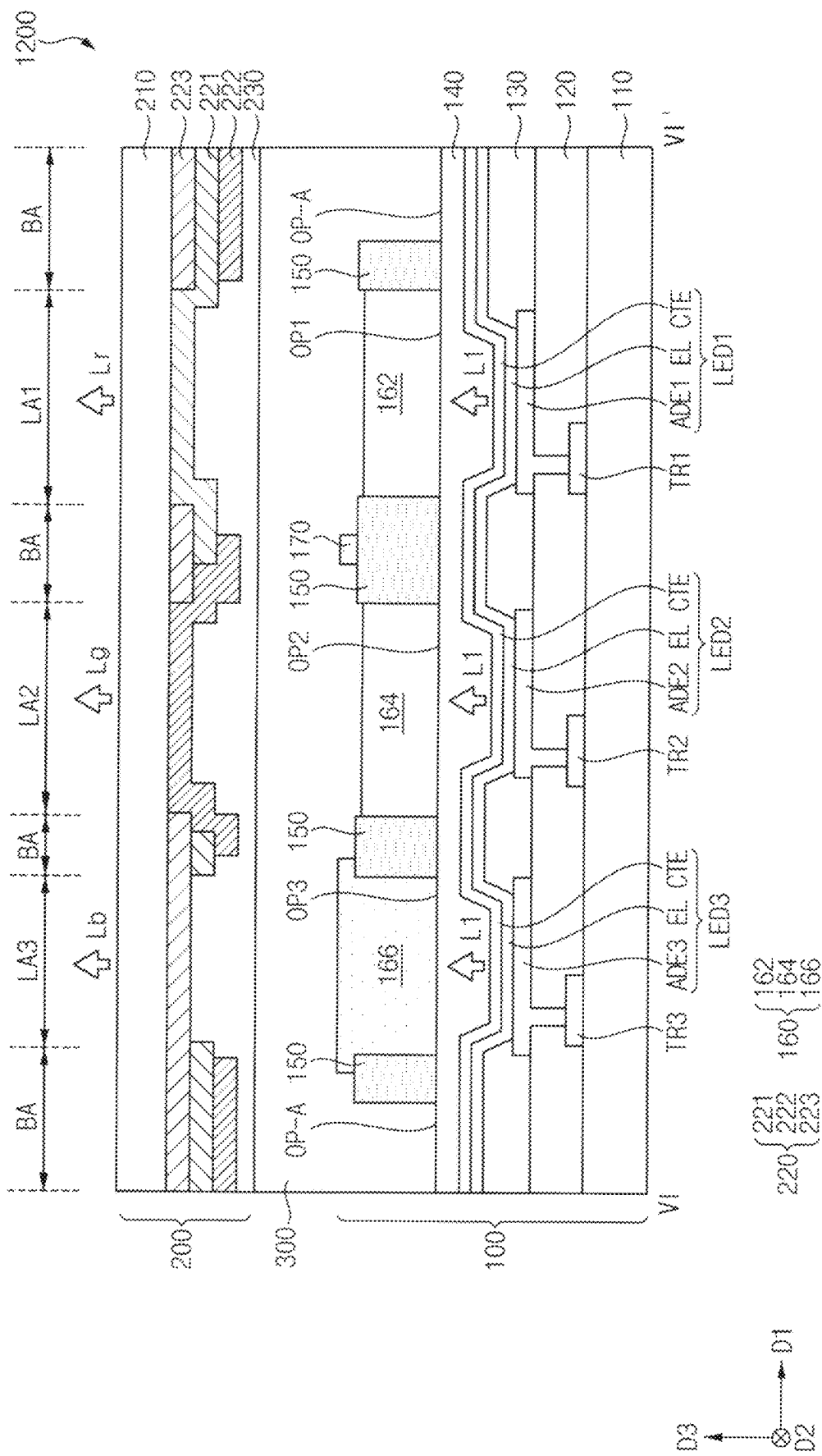
FIG. 19 is a cross-sectional view taken along line VI-VI' of FIG. 14.

FIG. 17 is a plan view illustrating a display device according to another alternative embodiment, FIG. 18 is an enlarged plan view illustrating a lower substrate of region 'C' of the display device of FIG. 17, and FIG. 19 is a cross-sectional view taken along line VI-VI' of FIG. 19. Particularly, the cross-section of the lower substrate 100 shown in FIG. 19 may correspond to the cross-section taken along line VII-VII' of FIG. 18.

An embodiment of a display device 1200 shown in FIGS. 17 to 19 may be substantially the same as the embodiments of the display device 1000 described above with reference to FIGS. 1 to 13, except for the compensation pattern 180 is omitted.

In an embodiment, the compensation pattern 180 may be omitted from the lower substrate 100. In such an embodiment, in the process of forming the light transmission pattern 166 and the column spacer 170 described above with reference to FIGS. 11 and 12, by adjusting the arrangement characteristics of the first area A and the second area B of the exposure mask MK, the area corresponding to the auxiliary opening OP-A in the organic material layer IML may be removed. Accordingly, the compensation pattern 180 may be omitted. In this case, an unnecessary excess space of the lower substrate 100 due to the auxiliary opening OP-A may be filled with a filler during the bonding process between the lower substrate 100 and the upper substrate 200.

According to embodiments, the lower substrate 100 of the display device may include the light transmission pattern 166, the column spacer 170, and the compensation pattern 180. Also, the light transmission pattern 166, the column spacer 170, and the compensation pattern 180 may be simultaneously formed through the single exposure and development process. Accordingly, the cost or time for a separate inkjet process for forming the light transmission pattern 166 is saved, and an additional exposure and development process for forming the column spacer 170 and the compensation pattern 180 may not be used. Accordingly, the display quality of the display device may be improved, the efficiency of a process for manufacturing the display device may be improved, and the manufacturing cost may be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a first substrate including first, second and third light emitting areas, and a light blocking area surrounding the first, second and third light emitting area;
light emitting elements disposed on the first to third light emitting areas of the first substrate, respectively;
a bank disposed on the light emitting elements to correspond to the light blocking area, wherein first, second and third openings exposing the light emitting elements, respectively, are defined in the bank;
a first color conversion pattern disposed in the first opening, wherein the first color conversion pattern converts a light of a first wavelength into a light of a second wavelength;
a second color conversion pattern disposed in the second opening, wherein the second color conversion pattern converts the light of the first wavelength into a light of a third wavelength;
a light transmission pattern disposed in the third opening, wherein the light transmission pattern transmits the light of the first wavelength; and
a column spacer disposed on the bank, wherein the column spacer has a same composition as the light transmission pattern.

2. The display device of claim 1, wherein each of the light transmission pattern and the column spacer includes a scattering particle.

3. The display device of claim 2, wherein
a content of the scattering particle included in the light transmission pattern is in a range of about 1 wt % to about 10 wt % based on a total weight of the light transmission pattern, and
a content of the scattering particle included in the column spacer is in a range of about 1 wt % to about 10 wt % based on a total weight of the column spacer.

4. The display device of claim 1, wherein a portion of the light transmission pattern is in contact with an upper surface of the bank.

5. The display device of claim 1, further comprising:
a compensation pattern, wherein an auxiliary opening is defined in the bank to correspond to the light blocking area, and the compensation patter is disposed in the auxiliary opening.

6. The display device of claim 5, wherein the compensation pattern has a same composition as the light transmission pattern and the column spacer.

7. The display device of claim 6, wherein the compensation pattern includes a scattering particle.

8. The display device of claim 5, wherein the compensation pattern is spaced apart from an upper surface of the bank.

9. The display device of claim 5, wherein a portion of the compensation pattern is in contact with an upper surface of the bank.

10. The display device of claim 9, wherein the upper surface of the bank is covered by the light transmission pattern, the column spacer, and the compensation pattern.

11. The display device of claim 1, wherein a width of the third opening is smaller than a width of the first opening and a width of the second opening.

12. The display device of claim 1, further comprising:
a second substrate disposed opposite to the first substrate; and
a color filter layer disposed under the second substrate, wherein the color filter layer includes:
a first color filter overlapping the first color conversion pattern, wherein the first color filter selectively transmits the light of the second wavelength among the lights of the first to third wavelengths;
a second color filter overlapping the second color conversion pattern, wherein the second color filter selectively transmits the light of the third wavelength among the lights of the first to third wavelengths; and
a third color filter overlapping the light transmission pattern, wherein the third color filter selectively transmits the light of the first wavelength among the lights of the first to third wavelengths.

13. The display device of claim 12, further comprising:
a refractive layer disposed under the color filter layer.

14. A method of manufacturing a display device, the method comprising:
providing light emitting elements in light emitting areas of a first substrate including the light emitting areas and a light blocking area surrounding the light emitting areas;
providing a thin film encapsulation layer covering the light emitting elements;
providing a bank on the thin film encapsulation layer, wherein first to third openings exposing the light emitting elements, respectively, are formed in the bank;
providing a first color conversion pattern in the first opening;
providing a second color conversion pattern in the second opening;
providing an organic material layer on the thin film encapsulation layer to cover the bank, the first color conversion pattern, and the second color conversion pattern, and to fill the third opening; and
forming a light transmission pattern and a column spacer by removing an area corresponding to the first color conversion pattern and an area corresponding to the second color conversion pattern of the organic material layer.

15. The method of claim 14, wherein the light transmission pattern and the column spacer have a same composition as each other.

16. The method of claim 15, wherein each of the light transmission pattern and the column spacer includes a scattering particle.

17. The method of claim 14, wherein
an auxiliary opening is further formed in the bank in an area corresponding to the light blocking area,
the organic material layer is provided to fill the auxiliary opening, and
the organic material layer filled in the auxiliary opening is defined as a compensation pattern.

18. The method of claim 17, wherein the compensation pattern has a same composition as the light transmission pattern and the column spacer.

19. The method of claim 18, wherein the compensation pattern includes a scattering particle.

20. The method of claim 14, the method further comprising:
bonding the first substrate, on which the first color conversion pattern, the second color conversion pattern, the light transmission pattern, and the column spacers are provided, and a second substrate, on which a color filter layer is provided, to each other.

* * * * *